US012601501B2

(12) United States Patent
Lee et al.

(10) Patent No.: US 12,601,501 B2
(45) Date of Patent: Apr. 14, 2026

(54) COOKING APPLIANCE

(71) Applicant: LG ELECTRONICS INC., Seoul (KR)

(72) Inventors: Dongmin Lee, Seoul (KR); Jaewon Byun, Seoul (KR); Ugjin Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 852 days.

(21) Appl. No.: 17/943,540

(22) Filed: Sep. 13, 2022

(65) Prior Publication Data

US 2023/0136254 A1 May 4, 2023

(30) Foreign Application Priority Data

Oct. 28, 2021 (KR) ........................ 10-2021-0146024
Feb. 3, 2022 (KR) ........................ 10-2022-0013987

(51) Int. Cl.
*F24C 15/00* (2006.01)
*H04N 7/18* (2006.01)
*H04N 23/57* (2023.01)
*H04N 23/90* (2023.01)
*H05K 7/20* (2006.01)

(52) U.S. Cl.
CPC ........... *F24C 15/006* (2013.01); *H04N 7/183* (2013.01); *H05K 7/20145* (2013.01); *H05K 7/20972* (2013.01); *H04N 23/57* (2023.01); *H04N 23/90* (2023.01)

(58) Field of Classification Search
CPC ...... H04N 7/183; H05B 6/642; H05B 6/6435; H05B 6/76
See application file for complete search history.

(56) References Cited

U.S. PATENT DOCUMENTS

2019/0234619 A1 8/2019 Lee
2021/0289593 A1 9/2021 Lee et al.

FOREIGN PATENT DOCUMENTS

CN 208740731 U * 4/2019
CN 211695039 10/2020
CN 211695039 U * 10/2020
DE 10 2010 062579 6/2012
(Continued)

OTHER PUBLICATIONS

European Search Report dated Jul. 9, 2024 issued in Application No. 22201890.5.

(Continued)

*Primary Examiner* — Thien S Tran
(74) *Attorney, Agent, or Firm* — KED & ASSOCIATES

(57) ABSTRACT

A cooking appliance is provided that may include a main body having a cavity, and a door that opens and closes the cavity. The door may include a display module including a display unit disposed in front of the door, and a cooling flow path unit disposed behind the display module, and having a flow path formed therein through which air for cooling flows. The cooling flow path unit may include an air guide configured to guide a flow of the air introduced into the door, and a blower mounted on the air guide. The air guide may include at least one inlet disposed on an upper portion, and through which external air is introduced, and a mounting hole formed under the inlet, and in which the blower mounted.

18 Claims, 18 Drawing Sheets

(56)     References Cited

FOREIGN PATENT DOCUMENTS

| EP | 3159610 | 4/2017 | |
| KR | 10-2008-0070408 | 7/2008 | |
| TW | 202124886 | 7/2021 | |
| WO | WO 2008/032902 | 3/2008 | |
| WO | WO 2008/091060 | 7/2008 | |
| WO | WO 2016/128370 | 8/2016 | |
| WO | WO-2019167639 A1 * | 9/2019 | .............. F24C 15/34 |

OTHER PUBLICATIONS

European Office Action issued in Application No. 22201890.5 dated Feb. 27, 2023.

* cited by examiner

COOKING APPLIANCE

CROSS-REFERENCE TO RELATED APPLICATION(S)

This application claims priority to and benefit of Korean Patent Application No. 10-2021-0146024 filed in Korea on Oct. 28, 2021, and 10-2022-0013987 filed in Korea on Feb. 3, 2022 which is hereby incorporated by reference as if fully set forth herein.

BACKGROUND

1. Field

A cooking appliance is disclosed herein.

2. Background

The content described in this section merely provides background information and does not constitute related art.

A cooking appliance is a home appliance that cooks food or other items (hereinafter, collectively "food") using microwaves and/or heat from a heater, which are type(s) of electromagnetic waves. The cooking appliance may generally include a cavity, which is a space in which food is placed and cooked, and a door that opens and closes the cavity.

A related art cooking appliance is disclosed in Korean Patent Application Laid-Open No. 10-2008-0070408, which is hereby incorporated by reference. When the cooking appliance is installed indoors, it is necessary to consider efficient use of the cooking appliance and an installation space, for example. For this reason, the cooking appliance may be disposed at a location adjacent to a heating cooking device, for example, a heating-type oven, or a gas range, for example. More specifically, the cooking appliance may be disposed above the heating cooking device.

When the cooking appliance is disposed above the heating cooking device, a user may conveniently cook food by reducing his/her movement in an environment where the cooking appliance and the heating cooking device are adjacent to each other. In addition, heat and oil mist, for example, generated from the heating cooking device may be discharged to the outside using the cooking appliance as a hood.

In a state in which the cooking appliance is disposed above the heating cooking device, the heat and oil mist, for example, generated from the heating cooking device disposed below the cooking appliance may adversely affect an operation of the cooking appliance. For example, a display unit may be mounted on a front surface of a door provided in the cooking appliance in order to provide various types of information to the user. The user may know a cooking state of the cooked food through the display unit.

In addition, when the display unit is connected to another home appliance and serves as a hub of the home appliance, information other than cooking information of food may be obtained through the display unit. In addition, the user may input a command required for cooking and other various commands into the display unit through a touch method.

In the state in which the cooking appliance is disposed above the heating cooking device, the heat and oil mist, for example, generated from the heating cooking device may penetrate into the display unit and other components mounted on the door. It is necessary to prevent the display unit and other components mounted on the door of the cooking appliance from being damaged or malfunctioning due to such heat and oil mist, for example.

In addition, the door may be provided with an air guide in which a flow path of air flowing therein is formed in order to form an air curtain on the door and cool components inside of the door. At this time, when air leaks from a gap at an edge of the air guide, it may cause the air flowing inside of the door to interfere with the forming of the air curtain or cooling the inside of the door. Accordingly, there is a need for structure for preventing the air from leaking through the gap at the edge of the air guide.

BRIEF DESCRIPTION OF THE DRAWINGS

Embodiments will be described in detail with reference to the following drawings in which like reference numerals refer to like elements, and wherein.

DETAILED DESCRIPTION

Figure 1:
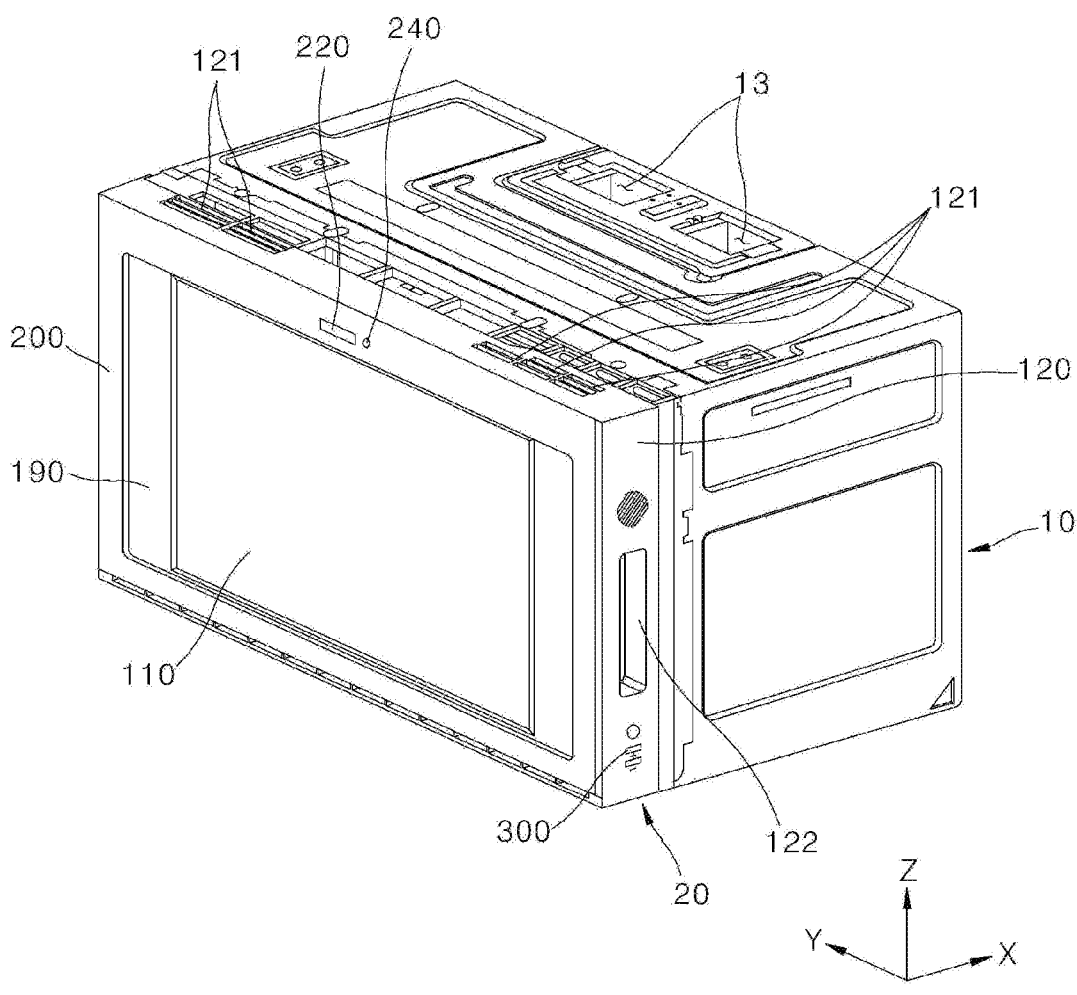
FIG. 1 is a perspective view of a cooking appliance according to an embodiment.

Objects, features, and advantages will be described hereinafter with reference to the accompanying drawings, and accordingly, those skilled in the art to which embodiments pertain will be able to easily practice the technical spirit. In describing embodiments, when it is determined that description of a known technique related to the may unnecessarily obscure the gist, unnecessary description will be omitted. Hereinafter, embodiments will be described with reference to the accompanying drawings. In the drawings, the same reference numerals are used to indicate the same or similar components.

Although the first and second, for example, are used to describe various components, it goes without saying that these components are not limited by these terms. These terms are only used to distinguish one component from other components, and unless otherwise stated, it goes without saying that the first component may also be the second component.

Throughout, unless specifically stated otherwise, each component may be singular or plural.

As used herein, the singular expression includes the plural expression unless the context clearly dictates otherwise. In the present application, terms such as "consisting of" or "comprising" should not be construed as necessarily including all of the various components or various steps described in the specification, and should be construed that some components or some steps may not be included, or additional components or steps may be further included.

Throughout, when "A and/or B" is used, it means A, B or A and B, unless specifically stated otherwise, and when "C to D" is used, it means greater than or equal to C and smaller than or equal to D unless specifically stated otherwise.

Throughout, "upward-downward direction" means the upward-downward direction of the cooking appliance in a state in which the cooking appliance is installed for daily use. "Leftward-rightward direction" means a direction perpendicular to the upward-downward direction, and the front-ward-rearward direction means a direction perpendicular to both the upward-downward direction and the leftward-rightward direction. "Bilateral direction" or "lateral direction" has the same meaning as the leftward-rightward direction, and these terms may be used interchangeably in the present specification.

Figure 2:
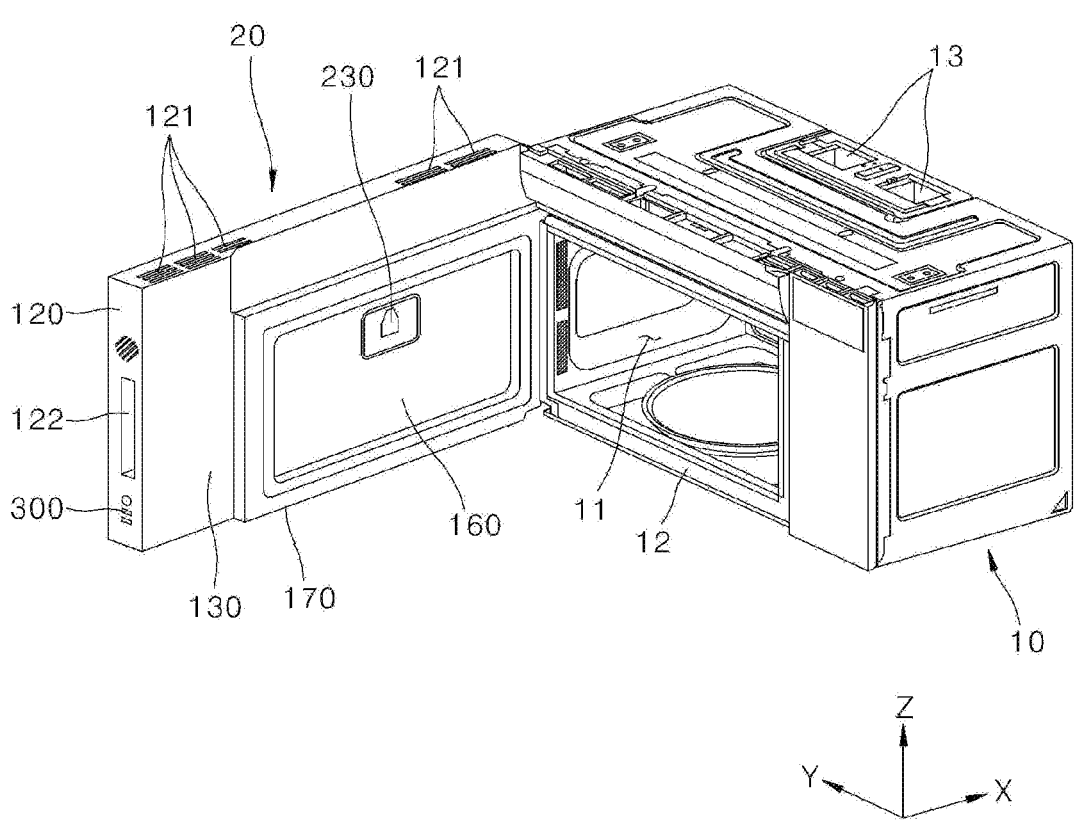
FIG. 2 is a view showing a state in which a door of the cooking appliance of FIG. 1 has been opened.

FIG. 1 is a perspective view of a cooking appliance according to an embodiment. FIG. 2 is a view showing a state in which a door of the cooking appliance of FIG. 1 has been opened.

The cooking appliance according to an embodiment may be disposed at a location spaced apart from a heating cooking device in an upward-downward direction above a location where the heating cooking device, for example, a heating-type oven or a gas range, for example, is disposed. The placement of the cooking appliance may allow a user to conveniently use cooking devices including the cooking appliance. In addition, the cooking appliance may serve as a hood of the heating cooking device disposed thereunder. In this case, the cooking appliance may be provided with components for use as a hood.

The cooking appliance may cook food using microwaves, and/or heat from a heater, which are type(s) of electromagnetic waves. The cooking appliance may include a main body 10 in which a cavity 11 is formed, and a door 20 that opens and closes the cavity 11.

Food to be cooked may be placed in the cavity 11. The door 20 may be disposed in front of the cavity 11 and rotatably mounted on the main body 10 to open and close the cavity 11.

A vent hole 13 through which air suctioned in by a suction unit provided on a lower portion of the main body 10 is discharged to the outside may be provided in an upper portion of the main body 10. The suction unit may be provided at a lower portion of the main body 10 of the cooking appliance. Accordingly, the cooking appliance may serve as a hood for suctioning the air discharged from the heating cooking device disposed thereunder to discharge the air to the outside.

The main body 10 may further include a front panel 12 provided on an edge of an entrance of the cavity 11, and having one surface disposed to face one surface of a choke member or choke 170 when the door 20 is closed to close the cavity 11.

The front panel 12 may be provided to surround the edge of the entrance of the cavity 11 and protrude with a predetermined width. Accordingly, when the door 20 is closed, an edge portion of the door 20 and the cavity 11 may overlap each other.

This structure may allow the front panel 12 to seal the cavity 11 in a state in which the door 20 is closed, thereby preventing oil, moisture, and oil mist, for example. generated in the process of cooking food placed in the cavity 11 from being discharged to the outside through an inlet of the cavity 11.

Figure 3A:
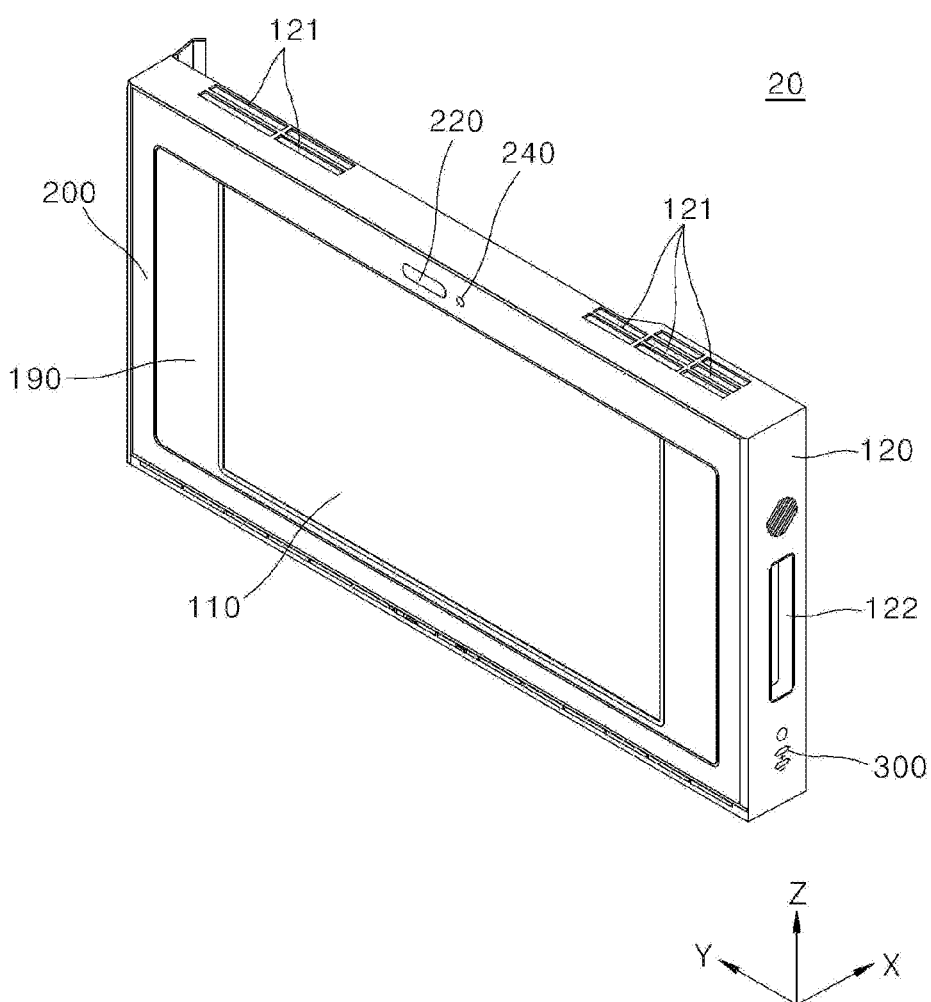
FIG. 3A is a perspective view of the door of the cooking appliance of FIG. 1.
Figure 3B:
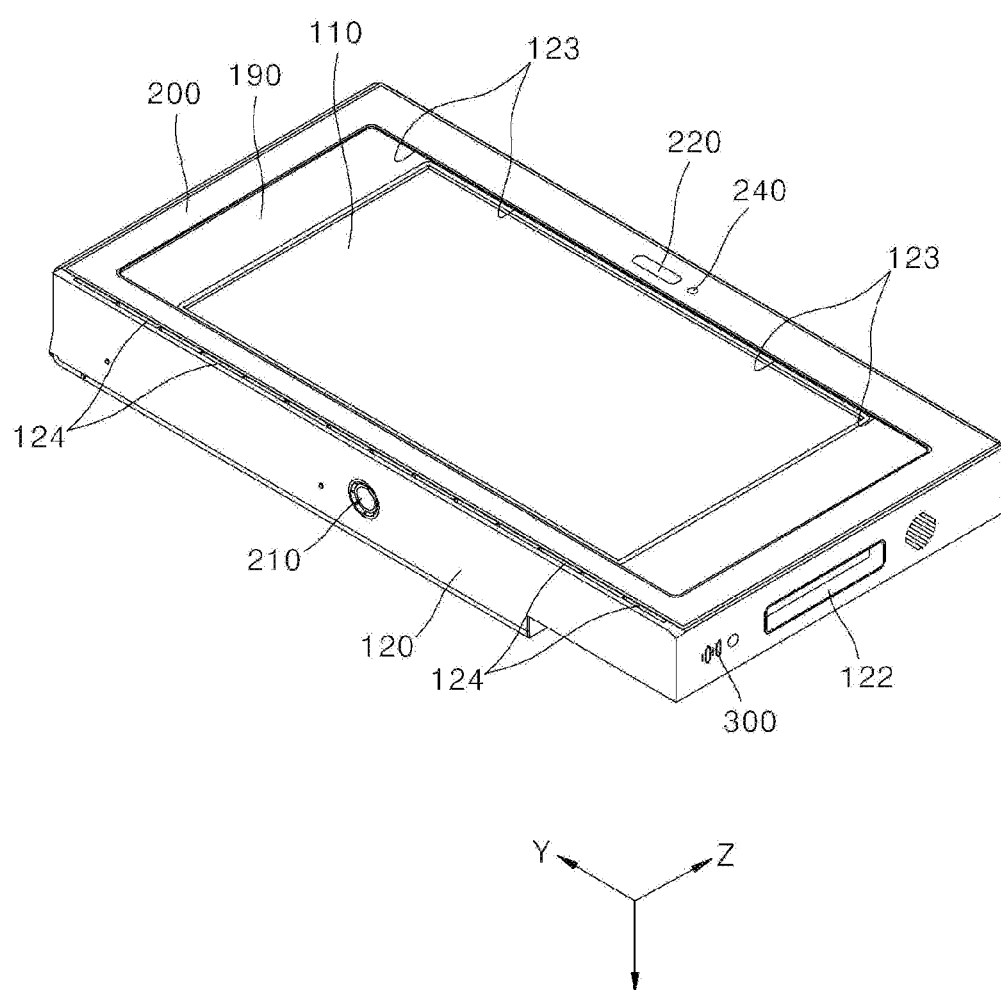
FIG. 3B is a view of the door of FIG. 3A from another direction.
Figure 4A:
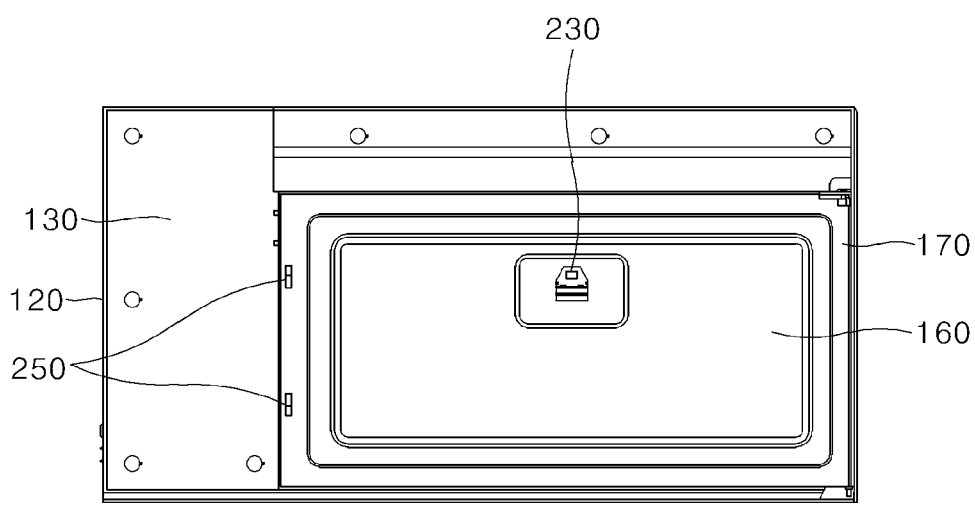
FIG. 4A is a rear view of the door of FIG. 3A.
Figure 4B:
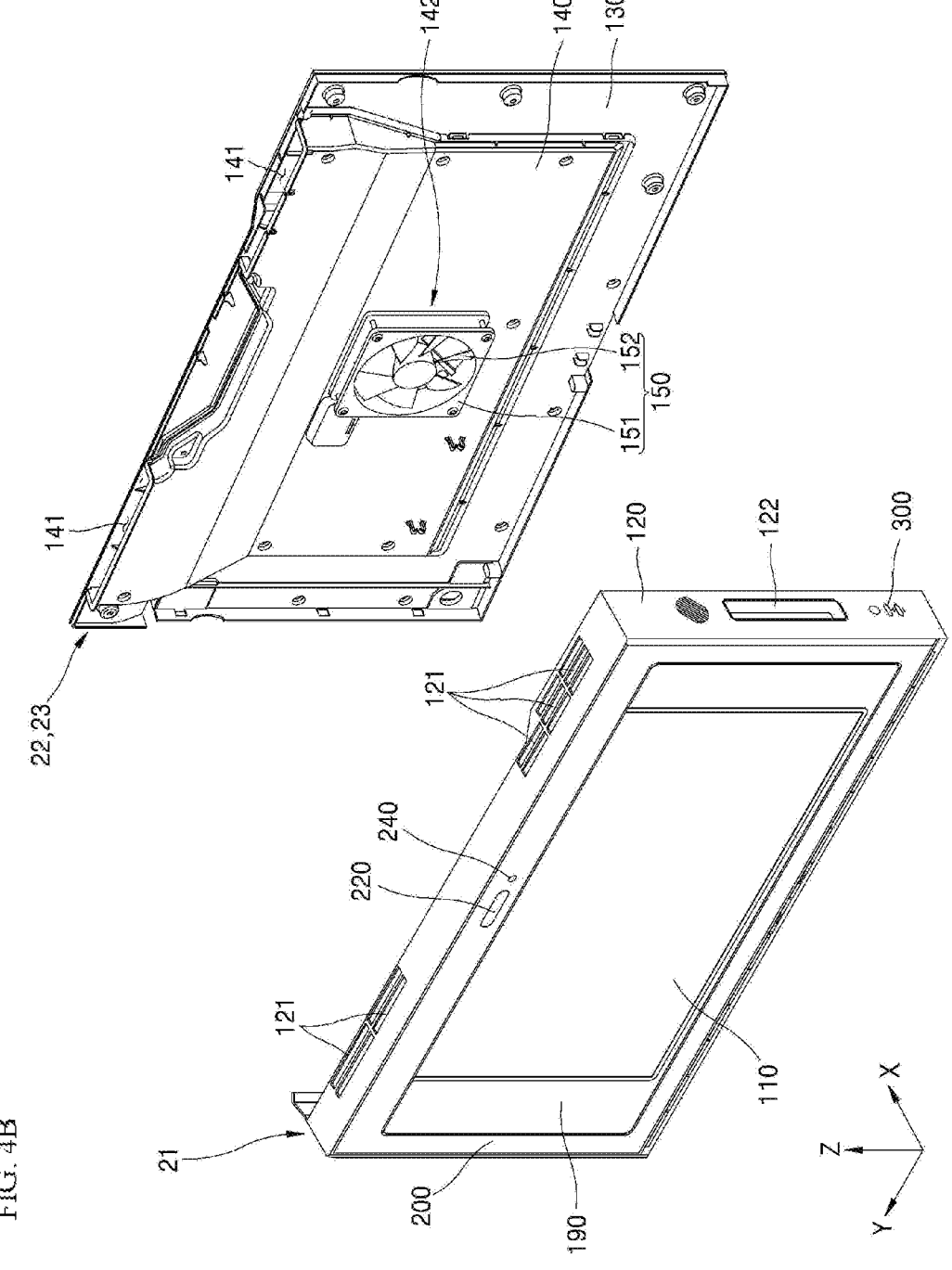
FIG. 4B is an exploded perspective view of a portion of the door according to an embodiment.
Figure 4C:
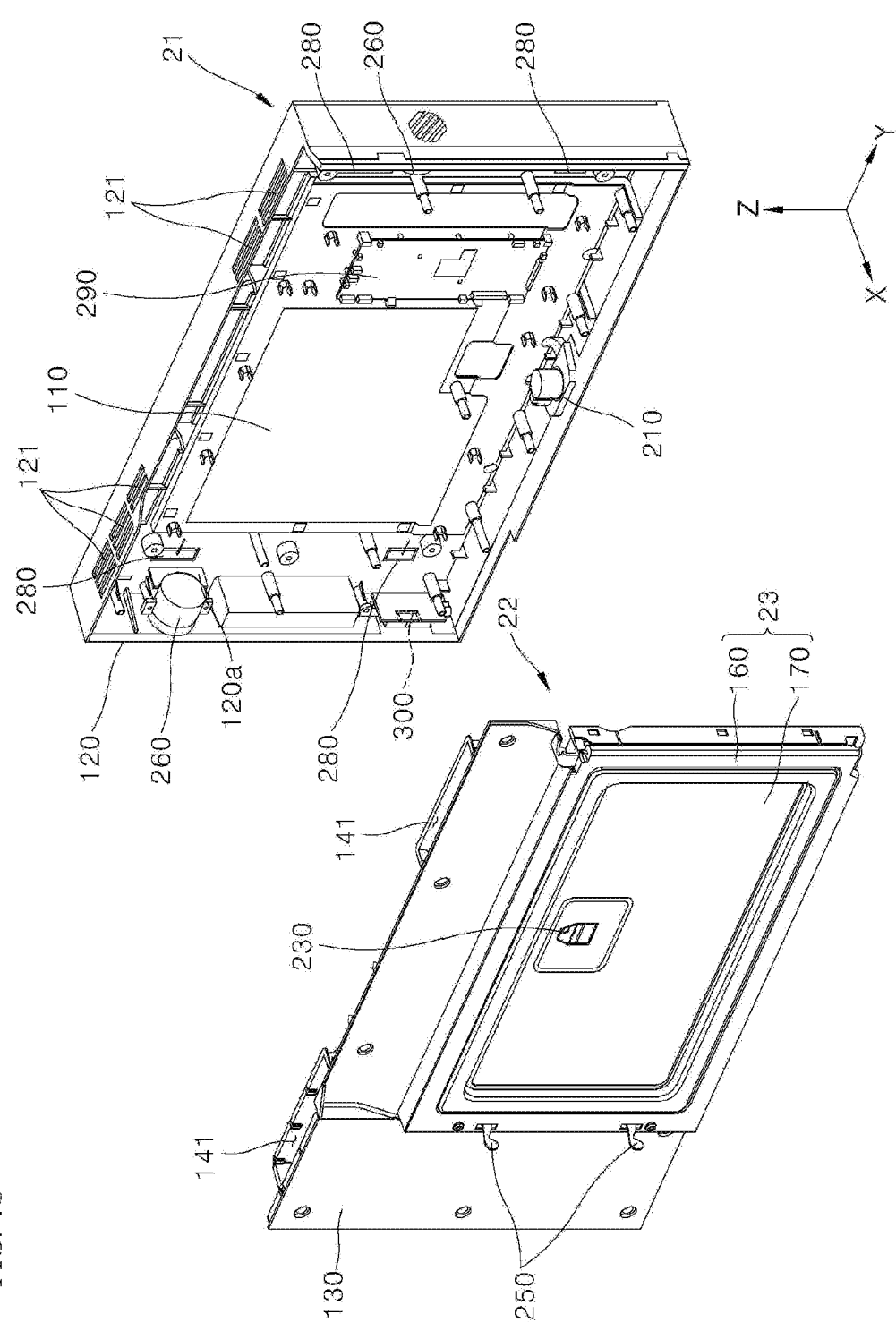
FIG. 4C is a view of the door of FIG. 4B from another direction.

FIG. 3A is a perspective view of the door of the cooking appliance of FIG. 1 according to an embodiment. FIG. 3B is a view of the door of FIG. 3A from another direction. FIG. 4A is a rear view of the door of FIG. 3A. FIG. 4B is an exploded perspective view showing a portion of the door according to an embodiment. FIG. 4C is a view of the door of FIG. 4B from another direction.

The door 20 may include a display module 21, a cooling flow path unit 22, and a shielding unit 23. The display module 21 may be disposed in front of the door 20, and the user may see an inside of the cavity 11 of the cooking appliance through the display module 21.

The cooling flow path unit 22 may be disposed behind the display module 21, and a flow path through which air for cooling may flow may be formed therein. The air flowing into the door 20 may flow into the door 20 through the cooling flow path unit 22 to cool the door 20.

The shielding unit 23 may be disposed behind the cooling flow path unit 22, and may shield electromagnetic waves generated from the main body 10. The shielding unit 23 may protect the user by blocking the electromagnetic waves generated in the cavity 11 and propagating to the outside of the cooking appliance. For example, the shielding unit 23 may serve to block the electromagnetic waves (microwaves) generated to cook food in the main body 10 from being discharged to the outside of the door 20.

The cooling flow path unit 22 may be provided to cool electronic components mounted inside of the door 20, including a display unit 110 mounted on the display module 21. The air for cooling the door 20 may flow inside of the cooling flow path unit 22. The display unit 110 may be formed in a thin shape and provided so that an area of the display unit 110 occupies most of one surface of the door 20.

Accordingly, the display unit 110 may occupy most of the area of a front portion of the door 20, and a placement area of the display unit 110 may be increased, thereby improving user visibility. The user may conveniently check various types of information through the display unit 110 provided with a large screen.

As a size of the display unit 110 is increased, an amount of heat generated may increase. Accordingly, the display unit 110 in the door 20 needs to be effectively cooled. In this embodiment, the cooling flow path unit 22, through which cooling air flows, may be separately provided.

The cooling flow path unit 22 may be disposed behind the display unit 110, and thus, the display unit 110 may be effectively cooled by the air flowing through the cooling flow path unit 22. In addition, a heat-generating component mounted on the display module 21 may be cooled by the air flowing through the cooling flow path unit 22. In other words, the cooling flow path unit 22 may cool the display module 21 provided with the display unit 110 and other various heat-generating components. In order to effectively cool the display unit 110, the entire display unit 110 may be exposed to the air flowing through the cooling flow path unit 22. In addition, the airflow discharged to the outside of the door 20 through the cooling flow path unit 22 may form an air curtain to block heat and oil mist rising from the heating cooking device disposed below the cooking appliance.

The air flowing through the cooling flow path unit 22 may be branched inside of the cooling flow path unit 22 to be discharged to a top and bottom of the display module 21. The cooling air may be branched inside of the cooling flow path unit 22 and discharged to the top and bottom of the display module 21, so that the cooling air may flow while in contact with an entire rear surface of the display unit 110 to effectively cool the display unit 110.

In addition, the cooling air may be discharged to each of the top and bottom of the display module 21 to effectively form the air curtain around the display unit 110 and the door 20, so that the heat and oil mist rising from the heating cooking device disposed below the cooking appliance may be effectively blocked by the air curtain.

The display module 21 may be provided with the display unit 110, a camera, and other electronic components, and the cooling flow path unit 22 may be provided with electronic components, such as a blowing device or blower 150 operated by a motor. Accordingly, the shielding unit 23 configured to shield the electromagnetic waves generated from the main body may be provided behind the cooling flow path unit 22 in order to protect the user and the electronic components from electromagnetic waves.

The display unit 110 and various electronic components may be disposed in the display module 21, the cooling flow path unit 22 in which the flow path of the air for cooling the display module 21 is formed may be disposed behind the display module 21, and the shielding unit 23 configured to shield electromagnetic waves from reaching the electronic components provided in the display module 21 may be disposed behind the cooling flow path unit 22.

In this embodiment, the display module 21 configured to provide various types of information and convenience to the user may be disposed on a front surface of the cooking appliance, that is, at a front of the door 20. In addition, in this embodiment, there is a need for structure that effectively cools the components, such as the display unit 110 provided in the display module 21, effectively cools an inside of the door 20 provided with the display unit 110, for example, and at a same time, forms the flow path of the cooling air for forming the air curtain around the door 20, and also protects the electronic components mounted on the door 20 from electromagnetic waves. In order to satisfy this need, the display module 21 may be disposed at the front of the door 20, the cooling flow path unit 22 may be disposed behind the display module 21, and the shielding unit 23 may be disposed behind the cooling flow path unit 22.

In other words, in order to implement the door structure according to the above-described embodiment, the display module 21, the cooling flow path unit 22, and the shielding unit 23 that play their own roles may be sequentially disposed on the door 20 from the front to a rear in the door 20. In addition, the display module 21, the cooling flow path unit 22, and the shielding unit 23 may be stably coupled to each other to prevent the cooling air from flowing outside of the door 20 through other portions other than a first outlet 123 disposed at an upper portion of the display module 21 and a second outlet 124 at a lower portion of the display module 21. Hereinafter, the door 20 implemented using the above-described structure will be described.

The display module 21 may include the first outlet 123 and the second outlet 124. The first outlet 123 may be disposed at the upper portion of the display module 21, and the air flowing inside of the display module 21 may be discharged to the outside through the first outlet 123.

The second outlet 124 may be disposed at the lower portion of the display module 21, and the air flowing inside of the display module 21 may be discharged to the outside through the second outlet 124. In other words, the air flowing inside of the door 20 may be discharged to the outside through the first outlet 123 and the second outlet 124, respectively, disposed at the upper and lower portions of the door 20, so that the air may flow through the entire inside of the door 20 to effectively cool the entire door 20.

The display module 21 may include the display unit 110 and an outer panel 120. The display unit 110 may be disposed on a front surface of the door 20 to display videos or images.

The display unit 110 may display information necessary for cooking to provide the information to the user. In addition, the display unit 110 may receive a user's command in a touch recognition method.

The display unit 110 may be connected to communicate with other home appliances, and cameras and locks, for example, provided in a front door. In addition, the display unit 110 may be connected to communicate with an external device required by the user.

The user may receive information necessary for operations of home appliances, visits by outsiders, and other aspects of daily life from the display unit 110, and transmit commands to home appliances and other devices connected to the display unit 110 using the display unit 110. Accordingly, the door 20 including the display unit 110 may serve as a kind of Internet of Things hub that transmits information about home appliances and other devices necessary for daily life to the user, and transmits the user's commands to these devices.

The outer panel 120 may be disposed behind the display unit 110, and the display unit 110 may be mounted thereon. The outer panel 120 may have a hollow 1201 and may be provided in a shape having a predetermined width in the frontward-rearward direction of the door 20.

The hollow 1201 of the outer panel 120 may be closed by a rear surface of the display unit 110. Air flowing inside of the outer panel 120 may collide with the rear surface of the display unit 110 exposed to the hollow 1201 of the outer panel 120. Accordingly, the air flowing inside of the outer panel 120 may come into contact with the rear surface of the display unit 110 to cool the display unit 110. In addition, the air passing through a blowing fan or fan 152 may be exposed to the hollow 1201 of the outer panel 120 to cool heat-generating components, such as a speaker 260, a microphone 270, a communication unit 280, and a control board 290.

As the outer panel 120 has the above-described structure, the outer panel 120 may have an interior space, and various components may be built in in the interior space. A width in the frontward-rearward direction of the door 20 may be substantially determined by the outer panel 120.

A first aperture 121 into which air flows may be formed at a location corresponding to an inlet 141 in an upper surface of the outer panel 120. A plurality of the first aperture 121 may be provided.

The plurality of first apertures 121 may be slit-shaped holes arranged at intervals. This structure may somewhat prevent foreign substances from flowing into the door 20 through the first aperture 121.

A handle 122 may be provided on one side of the outer panel 120 to be used when the user opens and closes the door 20. The handle 122 may be formed, for example, by recessing a side portion of the outer panel 120.

A button device 300 may be mounted on one side of the outer panel 120, for example, just below a location where the handle 122 is formed. The user may supply electricity to the cooking appliance or cut off the electricity supply by manipulating the button device 300. Specific manipulation for operation of the cooking appliance is possible by inputting commands into the display unit 110.

The outer panel 120 may support various components, such as the display unit 110, the speaker 260, the microphone 270, the communication unit 280, and the control board 290, and may be formed with the first aperture 121 into which external air flows, and the first outlet 123 and the second outlet 124 through which air is discharged.

The door 20 may be provided with a camera. Images captured by the camera may be reproduced on the display unit 110, and the user may view images inside of the cavity 11 or of the lower portion of the cooking appliance through the display unit 110. The camera may include a first camera 210, a second camera 220, and a third camera 230.

The first camera 210 may be mounted on a lower portion of the outer panel 120 to capture a state of the lower portion of the door 20. As the first camera 210 is mounted on the lower portion of the outer panel 120 so that a gaze direction faces the lower portion of the cooking appliance, the first camera 210 may capture a heating cooking device disposed below the cooking appliance.

The user may observe a state of the heating cooking device and a state of food being cooked on the heating cooking device by the image captured by the first camera 210 and reproduced on the display unit 110.

The second camera 220 may be disposed on the upper portion of the door 20 and may capture the front of the door 20. The second camera 220 may capture the front of the cooking appliance.

The second camera 220 may pass through a baffle 190 and a front cover 200, which will be described hereinafter. The user may observe a situation in front of the cooking appliance captured and recorded by the second camera 220.

The second camera 220 may capture the user in front of the cooking appliance. Accordingly, the second camera 220 may be used for the user to make a video call with other people in a remote location outside of the front door using the display unit 110.

The third camera 230 may be mounted on a frame 160 described hereinafter, may be disposed to face the cavity 11, and may capture an image of the cavity 11. In other words, the third camera 230 may face the cavity 11 to capture a situation within the cavity 11. The user may observe a situation in which food is cooked in the cavity 11 through the image captured by the third camera 230.

The door 20 may include a human detection unit or human detector 240 disposed on the upper portion of the door 20, mounted by passing through the baffle 190 and the front cover 200, disposed at a location spaced apart from the second camera 220, and configured to detect a presence of the user in front of the cooking appliance. The human detector 240 may detect whether there is a person in front of the door 20 by, for example, infrared recognition or gesture recognition. A control unit provided in the cooking appliance may identify whether there is a user in front of the cooking appliance through the human detector 240.

When there is a user, for example, the control unit may operate the display unit 110 to activate functions of the cooking appliance necessary for the user's convenience and safety by taking an action to enable the user to use the display unit 110 immediately.

Figure 5:
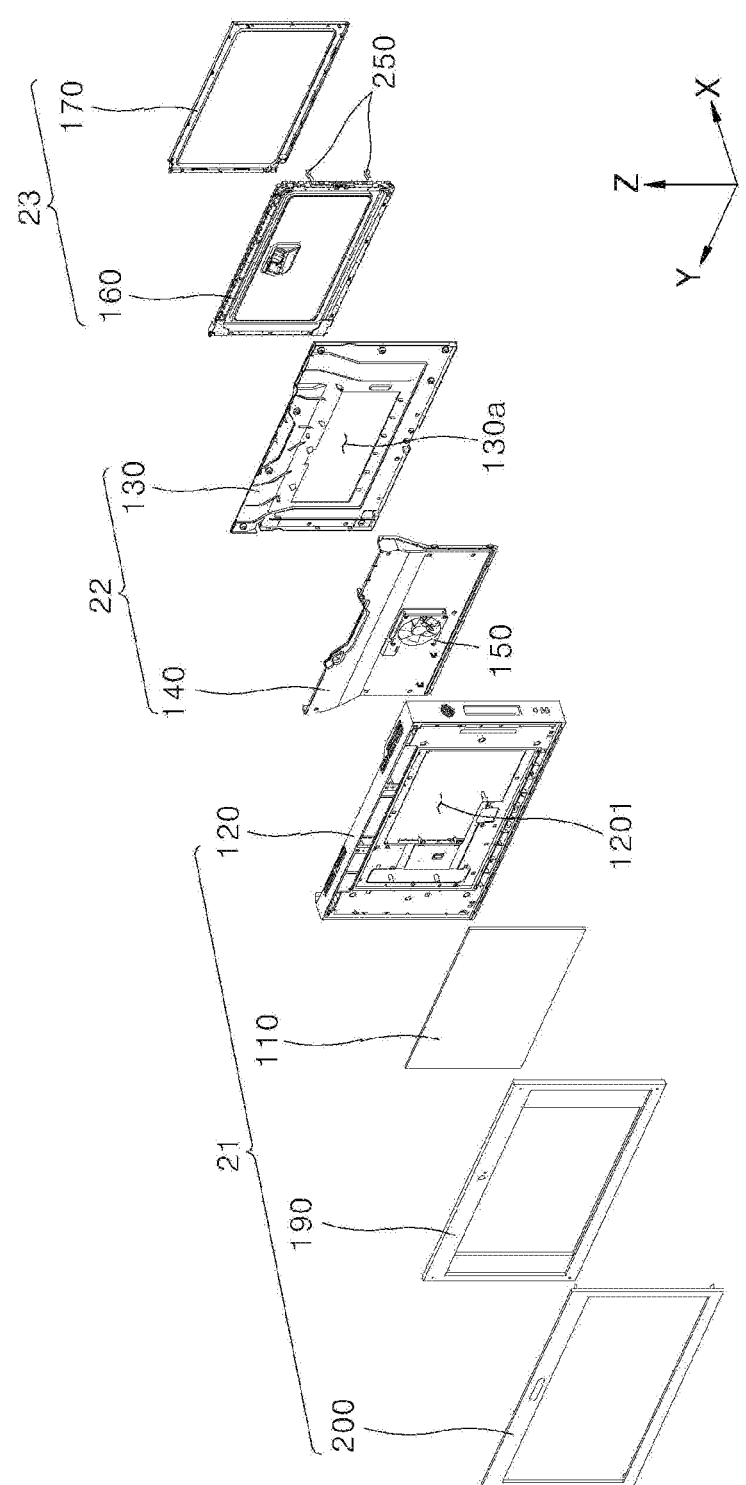
FIG. 5 is an exploded perspective view of the door according to an embodiment.
Figure 6:
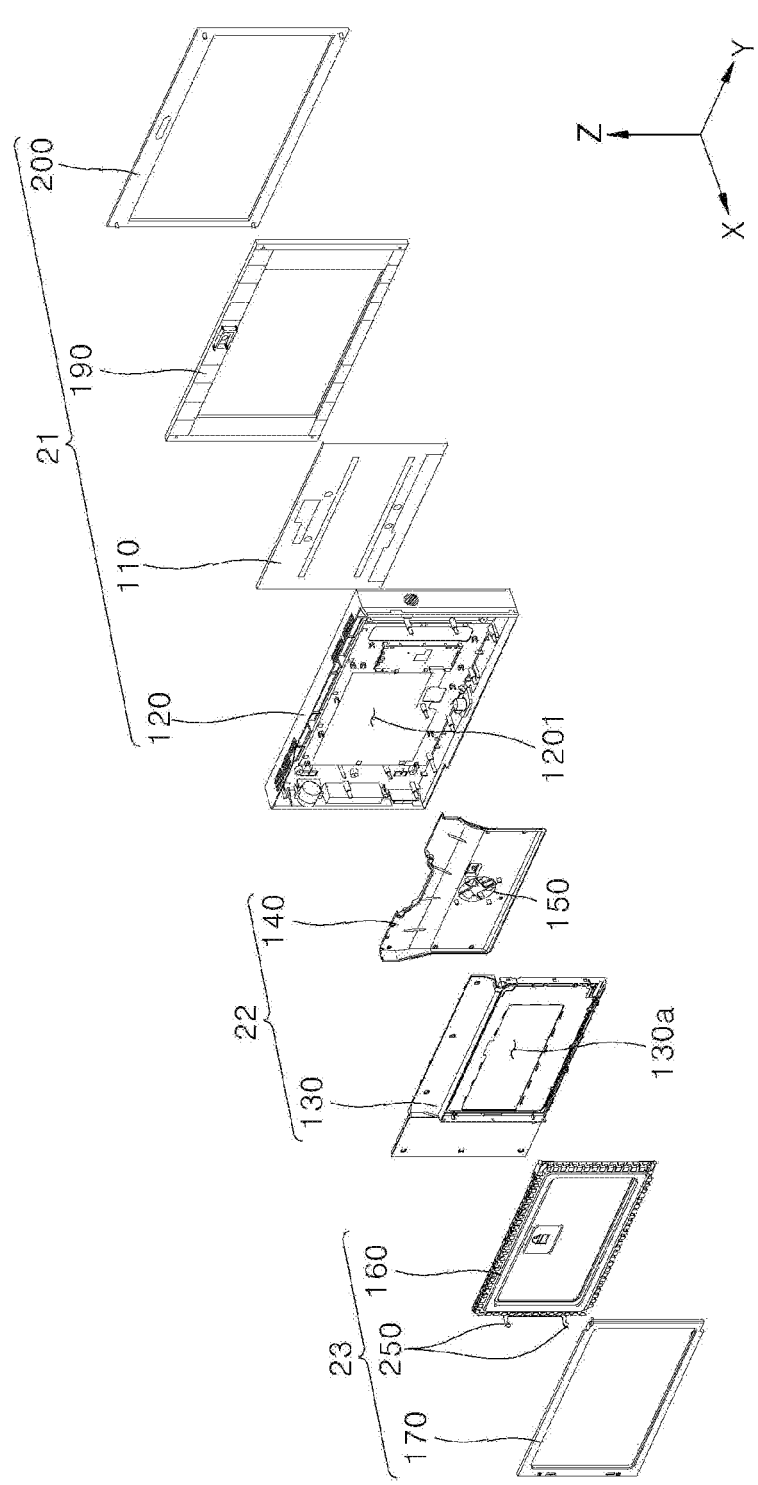
FIG. 6 is a view of the door of FIG. 5 from another direction.

FIG. 5 is an exploded perspective view of the door according to an embodiment. FIG. 6 is a view of the door of FIG. 5 from another direction.

The inner panel 130 may be disposed behind the display module 21. The cooling flow path unit 22 may include an inner panel 130, an air guide 140, and the blower 150. The inner panel 130 may be disposed behind the outer panel 120 and mounted on the outer panel 120. The air guide 140 described hereinafter may be mounted on the inner panel 130. The inner panel 130 along with the air guide 140 may form a space in which the air suctioned into the door 20 flows. The inner panel 130 may be mounted with the air guide 140 and coupled to the frame 160 to provide the space in which the air flowing into the door 20 flows.

The air guide 140 may be disposed between the display module 21 and the inner panel 130. The air guide 140 may be disposed between the outer panel 120 and the inner panel 130, and coupled to the inner panel 130. The air guide 140 may guide the flow of air flowing into the door 20 from the outside, and form the space in which the air may flow. The inner panel 130 and the air guide 140 may be coupled to each other to form the flow path of air.

The blower 150 may be mounted on the air guide 140. The blower 150 may forcibly blow the air introduced into the air guide 140 from a rear to a front of the air guide 140. The blower 150 may include a casing 151 and blowing fan or fan 152 mounted on the casing 151 to flow the air from the rear of the front of the air guide 140.

The shielding unit 23 may include the frame 160 and the choke 170. The frame 160 may be disposed behind the inner panel 130, may be coupled to the inner panel 130, and may have one side rotatably coupled to the main body 10. As the frame 160 rotates, the door 20 may be rotated to open and close the cavity 11 of the cooking appliance.

The frame 160 may be coupled to the inner panel 130 to form a flow path of air for cooling, and at the same time, may form an inner surface of the door 20 with a shielding structure that prevents leakage of electromagnetic waves, that is, the choke 170.

The choke 170 may be disposed behind the frame 160, may be coupled to the frame 160, and may block electromagnetic waves generated in the main body 10 from being discharged to the outside. The choke 170 may be generally provided in a quadrangular shape having a hollow, for example, and may surround an edge portion of the frame 160.

The display module 21 may include the baffle 190 and the front cover 200. The baffle 190 may be disposed in front of the display unit 110, may surround an edge of the display unit 110, and may be coupled to the outer panel 120 to mount the display unit 110 on the outer panel 120.

The baffle 190 may be generally formed in, for example, a quadrangular shape having a hollow to surround the edge of the display unit 110, and thus, may serve as a bezel of the display unit 110. The front cover 200 may be disposed in front of the baffle 190, and surround an edge of the baffle 190. The front cover 200 may be generally formed in a quadrangular shape having a hollow, for example, and may serve to stably couple the display unit 110 and the baffle 190 to the outer panel 120.

The door 20 may include a latch 250 mounted on the side of the frame 160, a portion of which protrudes from the frame 160. The latch 250 may be formed in a structure that is caught in a groove formed in the front panel 12 of the door 20. The latch 250 may stably maintain a state in which the door 20 is closed.

Figure 7:
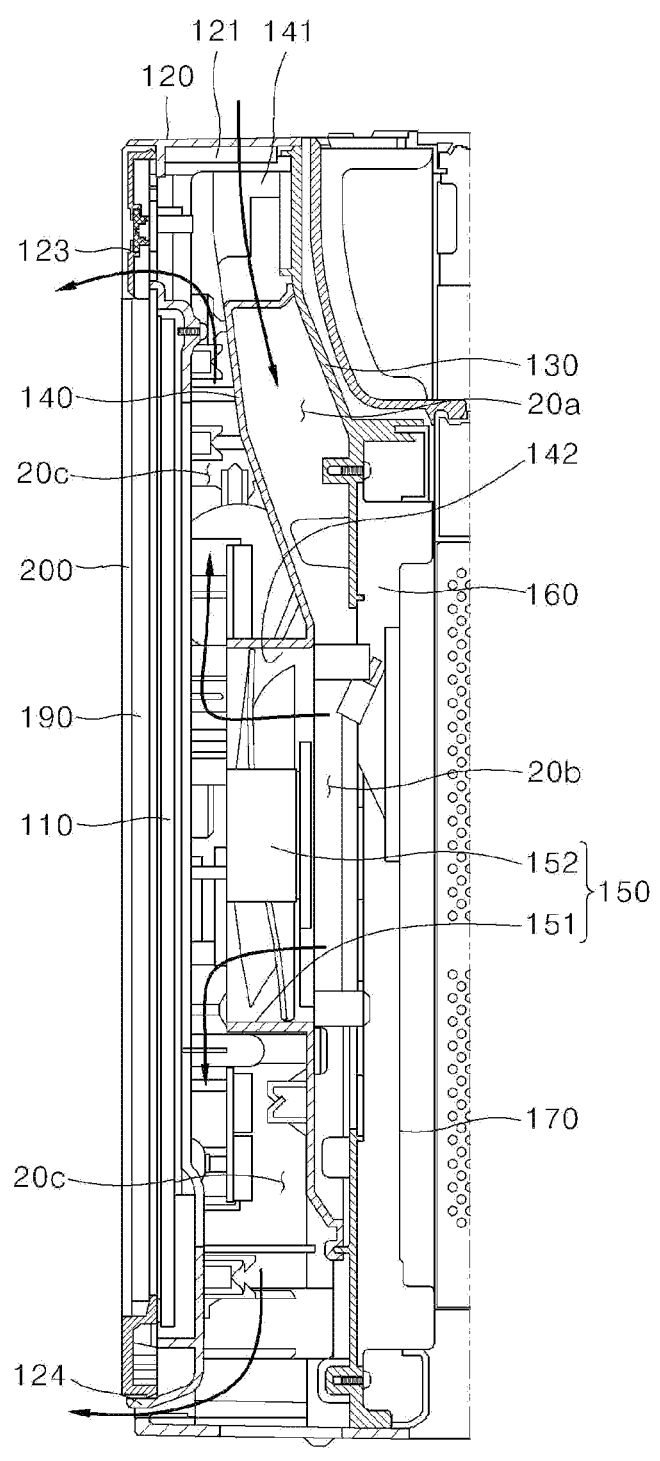
FIG. 7 is a side cross-sectional view of the door according to an embodiment.
Figure 8:
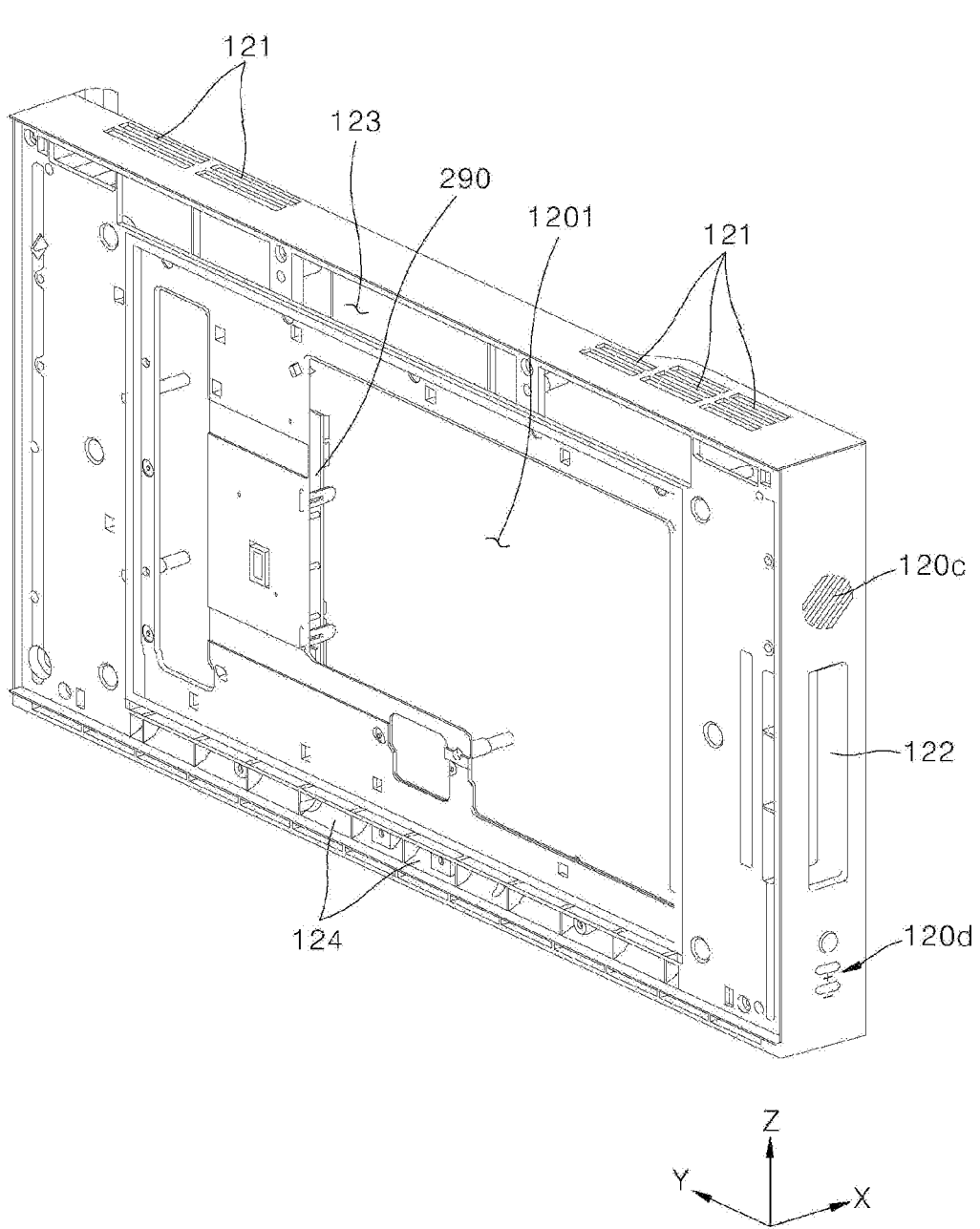
FIG. 8 is a perspective view of an outer panel according to an embodiment.
Figure 9A:
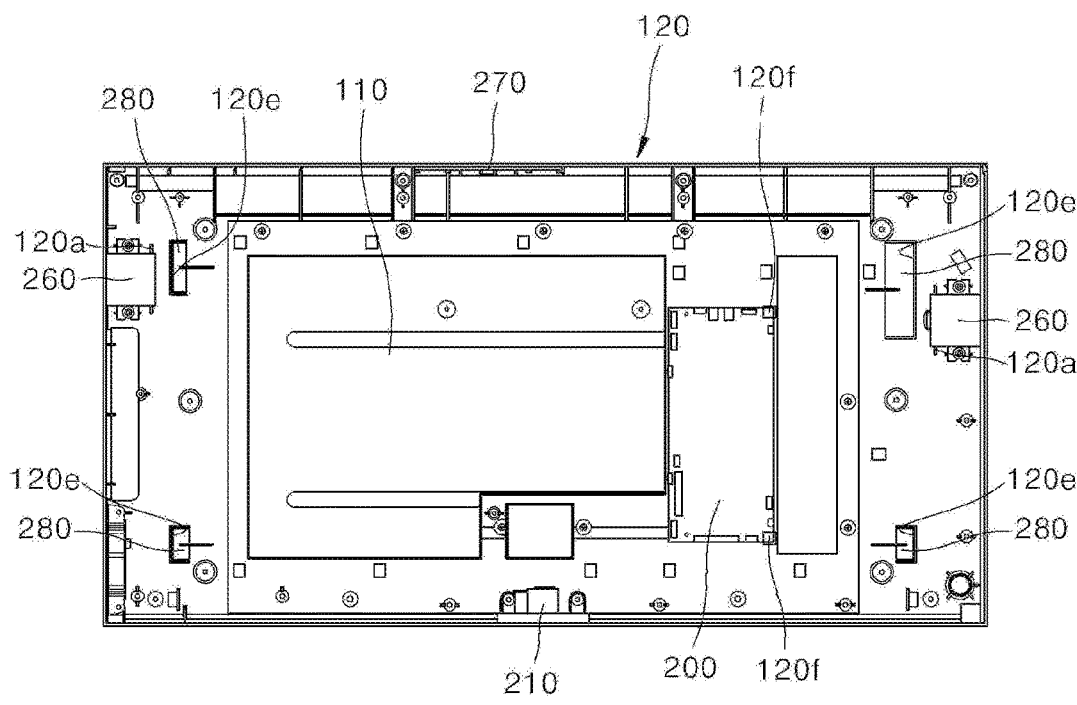
FIG. 9A is a rear view of the outer panel of FIG. 8.
Figure 9B:
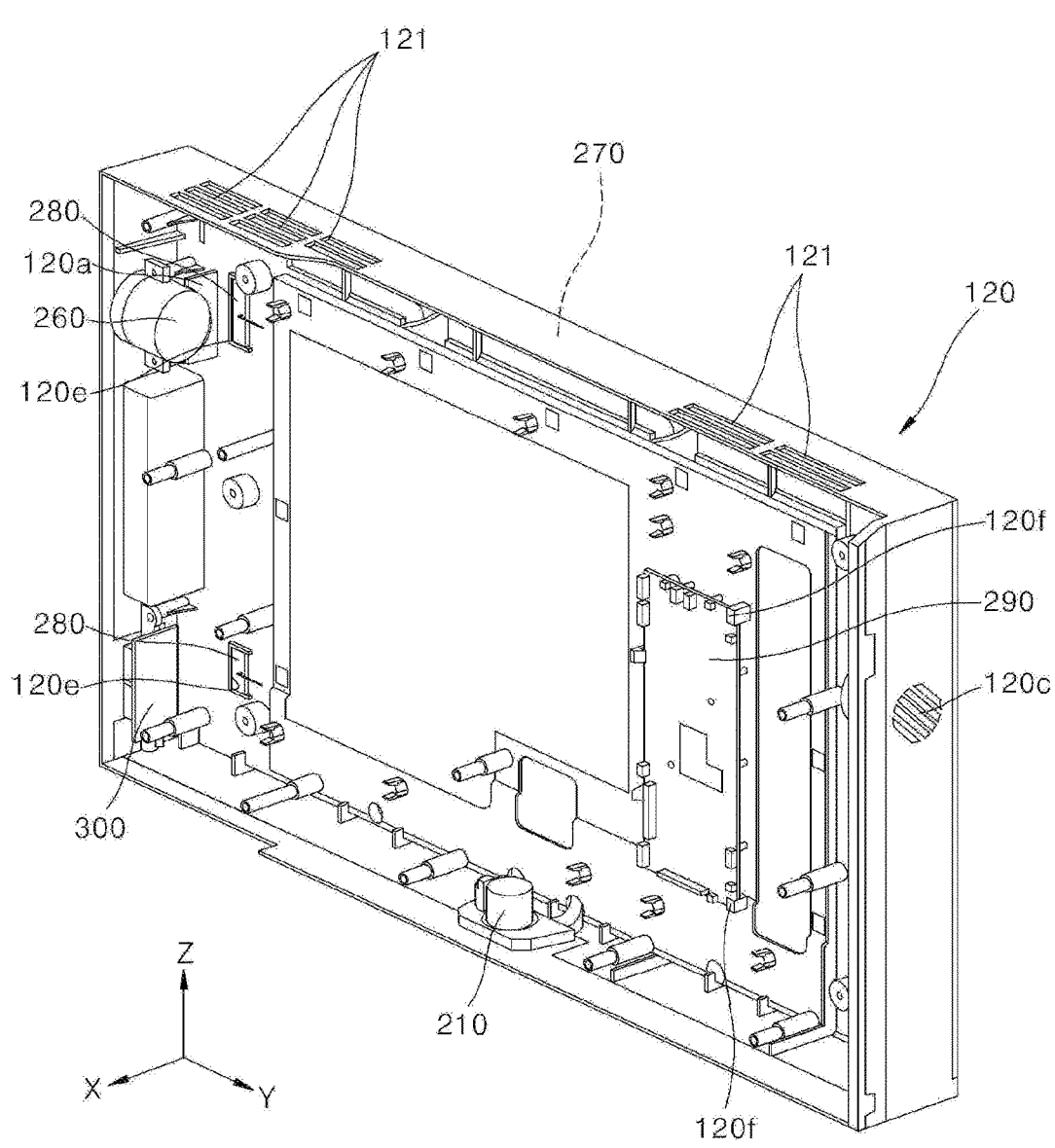
FIG. 9B is a view of the outer panel of FIG. 8 from another direction.
Figure 10:
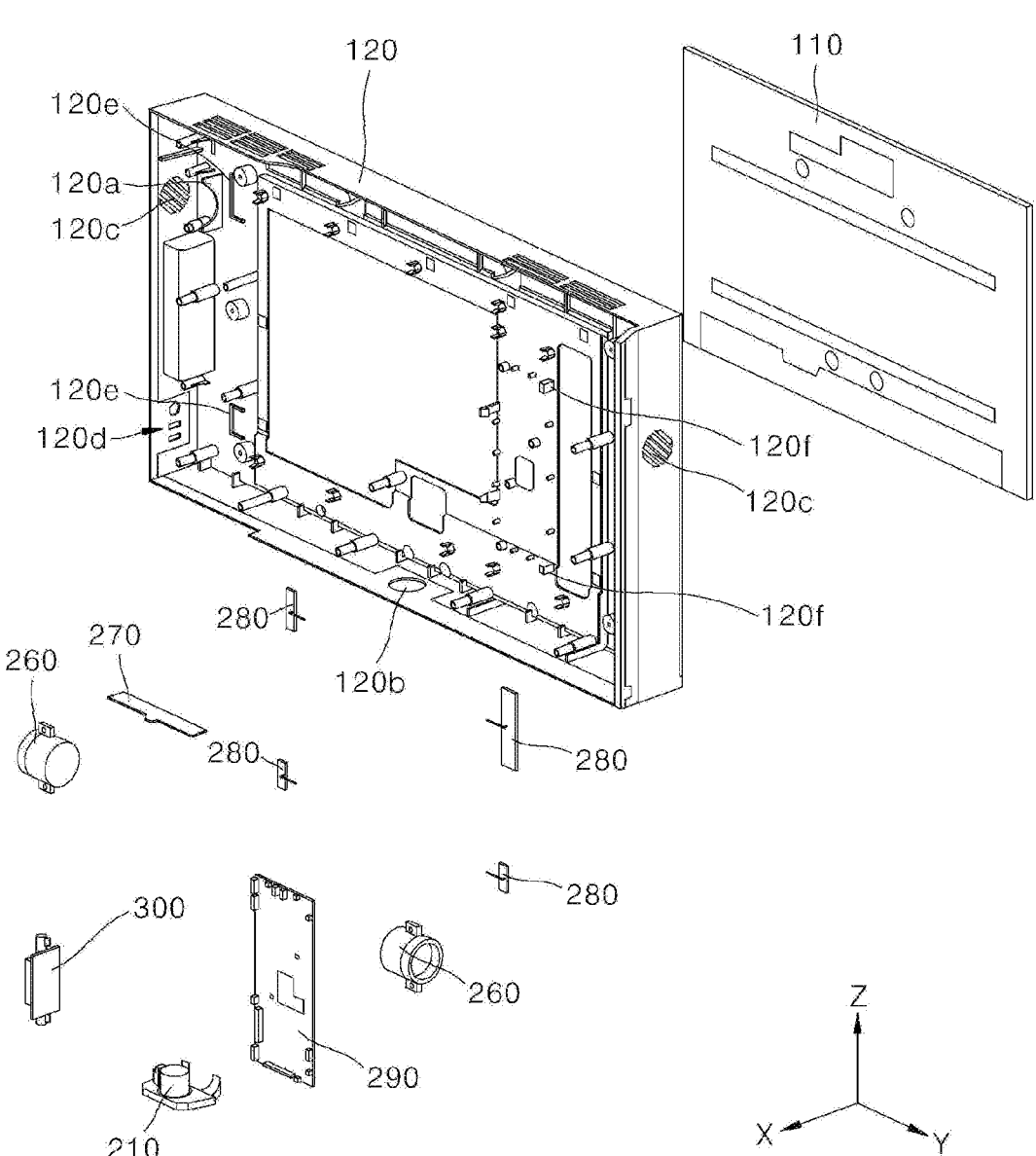
FIG. 10 is an exploded perspective view of a display unit and the outer panel according to an embodiment.
Figure 11:
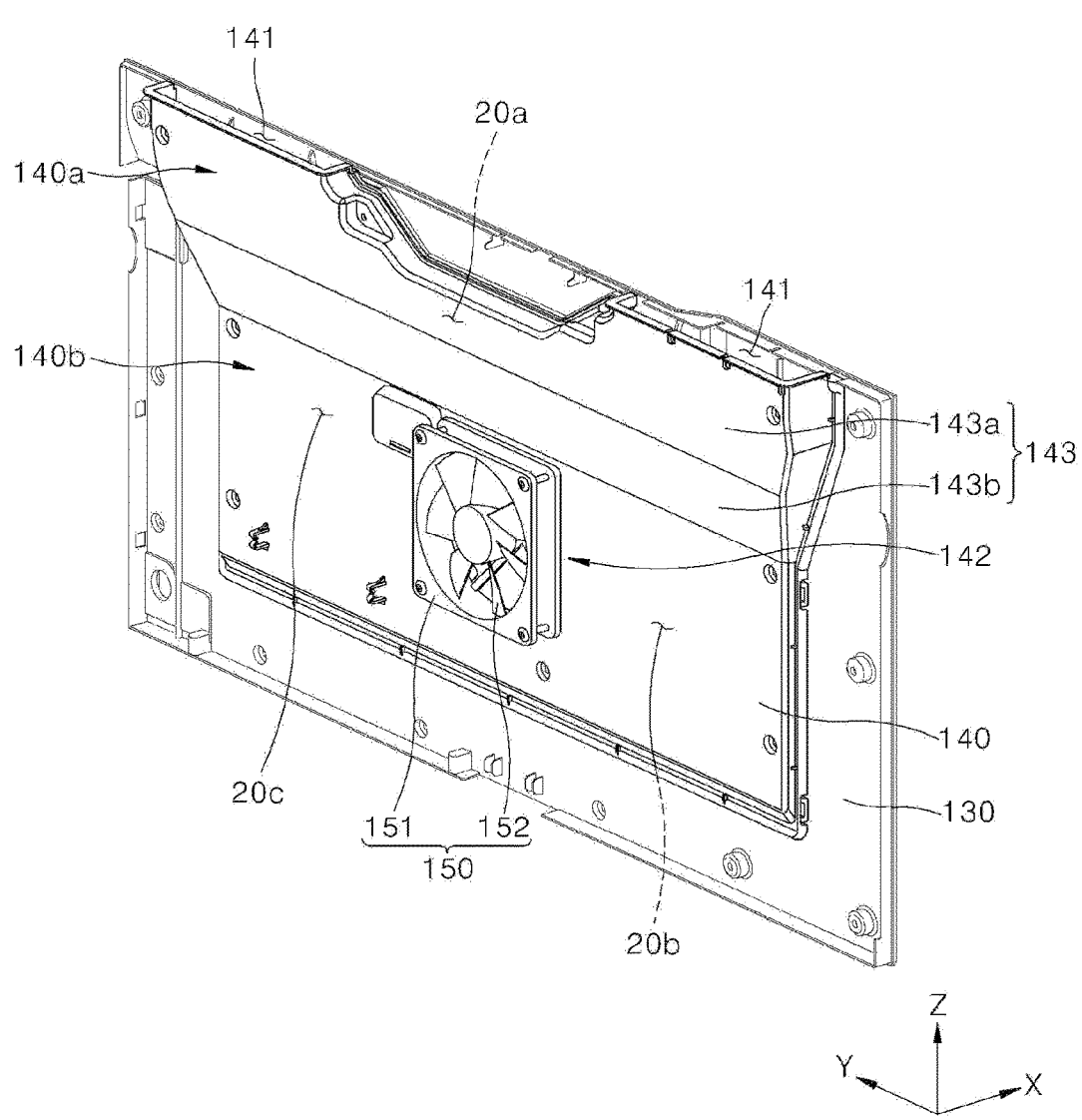
FIG. 11 is a view of an inner panel and an air guide according to an embodiment.

FIG. 7 is a side cross-sectional view of the door according to an embodiment. FIG. 8 is a perspective view of the outer panel according to an embodiment. FIG. 9A is a rear view of the outer panel according to an embodiment. FIG. 9B is a view of the outer panel of FIG. 8 from another direction. FIG. 10 is an exploded perspective view of the display unit and the outer panel according to an embodiment. FIG. 11 is a view showing the inner panel and the air guide according to an embodiment.

Referring to FIG. 10, the outer panel 120 may include the speaker 260, the microphone 270, and the communication unit 280. At least one speaker 260 may be mounted on a side of the outer panel 120. The speaker 260 may generate a voice, or an alarm sound, for example, necessary for operating the cooking appliance. In addition, the speaker 260 may generate all voices or alarm sounds, for example, for the door 20 including the display unit 110 of the door 20 to serve as an Internet of Things hub.

The microphone 270 may be mounted at a top of the outer panel 120 and may receive the user's voice. The user may input voice commands to operate the cooking appliance through the microphone 270. In addition, the microphone 270 may be a component of the door 20 serving as an Internet of Things hub.

The communication unit 280 may be mounted on the outer panel 120 at a location spaced apart from the speaker 260 and the microphone 270. As the door 20 serves as an Internet of Things hub, the communication unit 280 provided in the door 20 may be appropriately provided to perform various types of wired or wireless communication functions.

Accordingly, a plurality of the communication unit 280 may be provided Each communication unit 280 may be provided as a device corresponding to a different communication method.

For example, the communication unit 280 may be provided as a wireless communication device. Each communication unit 280 may be provided as any one of a ZigBee communication device, a Wi-Fi communication device, a jet wave communication device, and a Bluetooth communication device, for example. However, the communication method of the communication unit 280 is not limited thereto, and the communication unit 280 may also be provided as a wired communication device.

The control board 290 that controls the cooking appliance may be mounted on the outer panel 120. A control unit configured to control the cooking appliance may be implemented on the control board 290.

The outer panel 120 may be provided with a holder 120a, an opening hole 120b, a first through hole 120c, a second through hole 120d, a mounting guide 120e, and a fitting projection 120f. The holder 120a may be provided to support the speaker 260. The holder 120a may protrude from an inner wall of the outer panel 120, a portion of which may have an arc shape to correspond to a circular shape of the speaker 260.

The speaker 260 may be mounted on the holder 120a and provided on the outer panel 120. As a pair of speakers 260 is provided, a pair of holders 120a may also be provided and formed at a location corresponding to each of the pair of speakers 260.

The opening hole 120b may pass through a bottom of the outer panel 120. The first camera 210 may be disposed at a location adjacent to the opening hole 120b to be able to view the lower side of the outer panel 120 through the opening hole 120b.

The first through hole 120c may be formed in a side of the outer panel 120. The first through hole 120c may be provided adjacent to a location at which the speaker 260 is disposed. The first through hole 120c may allow the speaker 260 to communicate with the outside, and at the same time, may be formed in a mesh shape in order to prevent the speaker 260 from being exposed to the outside.

The speaker 260 may communicate with the outside of the outer panel 120 through the first through hole 120c to effectively transmit an alarm and other voices to the user. As a pair of speakers 260 is provided, a pair of first through holes 120c may also be provided and formed at a location corresponding to each of the pair of speakers 260.

The second through hole 120d may be formed in a lower portion of one side of the outer panel 120 to pass through the outer panel 120. A portion of the button device 300 mounted inside of the outer panel 120 through the second through hole 120d may be exposed to the outside of the outer panel 120. The user may manipulate the button device 300 by contacting the exposed portion of the outer panel 120.

The mounting guide 120e may be formed on an inner wall of the outer panel 120 to support the plurality of communication units 280. Accordingly, the mounting guide 120e may be provided in a same number as the plurality of communication units 280. The mounting guide 120e may guide the communication unit 280 to be mounted on the outer panel 120.

For example, the mounting guide 120e may be provided so that a projection having a shape corresponding to an edge of the communication unit 280 is formed on the inner wall of the outer panel 120. Each of the plurality of mounting guides 120e may be provided to have a shape and size corresponding to a shape and size of each of the plurality of communication units 280.

The fitting projection 120f may protrude from the inner wall of the outer panel 120. A plurality of fitting projections 120f may be provided and spaced apart from each other. The control board 290 may be fitted into the fitting projections 120f. For example, the fitting projection 120f may be disposed at a location adjacent to an edge of the plate-shaped control board 290.

Accordingly, the control board 290 may have corners fitted into the fitting projections 120f and may be mounted on the outer panel 120. A shape fitting structure corresponding to the shape of the control board 290 may be formed on the fitting projection 120f so that the corner of the control board 290 may be fitted thereto.

As shown in FIG. 8, the first outlet 123 may be disposed on the upper portion of the outer panel 120, and the second outlet 124 may be disposed on the lower portion of the outer panel 120. The first outlet 123 may be disposed on the upper portion of the outer panel 120, and the air blown by the blower 150 may be discharged to the outside. The second outlet 124 may be disposed on the lower portion of the outer panel 120, and the air blown by the blower 150 may be discharged to the outside.

Referring to FIG. 3B, when the door 20 is assembled, the first outlet 123 and the second outlet 124 may be partially blocked by the baffle 190 and the front cover 200. At this time, holes for discharging air may be formed at locations corresponding to the first outlet 123 and the second outlet 124 in the baffle 190.

The first outlet 123 may be provided at a location adjacent to an upper end of the display unit 110, and the second outlet 124 may be provided at a location adjacent to a lower end of the display unit 110. Accordingly, the air forcibly blown inside the door 20 by the blower 150 may be discharged to the outside at locations adjacent to upper and lower ends of the display unit 110 through the first outlet 123 and the second outlet 124.

The air discharged through the first outlet 123 may form the air curtain on the upper portion of the door 20. In addition, the air discharged through the second outlet 124 may form the air curtain on the lower portion of the door 20.

The term "air curtain" refers to means for blocking permeation of an external airflow into the door 20. In this embodiment, a boundary surface or a boundary zone in which the flow of air discharged from the inside of the door 20 through the first outlet 123 and the second outlet 124 forms a boundary against the flow of the external air may be referred to as an "air curtain".

The air curtain formed by the air discharged from the inside of the door 20 through the first outlet 123 and the second outlet 124 may prevent permeation of external air into the door 20. As the heating cooking device is disposed below the cooking appliance, heat generated when the heating cooking device is used and oil mist generated from food being cooked may rise and permeate into the cooking appliance.

The heat transmitted from the heating cooking device to the cooking appliance may damage components of the door 20 provided in the cooking appliance. In particular, components in which the display unit 110 and circuits and elements, for example, related to its operation are embedded may be vulnerable to heat.

In addition, the oil mist transmitted from the food being cooked may be attached to the door 20 provided in the cooking appliance. The oil mist may be attached to the surface of the display unit 110 to lower image quality of the display unit 110, and attached to the surfaces of other components mounted on the door 20 to damage these components.

In this embodiment, the airflow discharged to the outside of the door 20 through the first outlet 123 and the second outlet 124 provided in the door 20 forms the air curtain, so that the heat and oil mist rising from the heating cooking device disposed below the cooking appliance may be effectively blocked by the air curtain. Accordingly, it is possible to effectively prevent various electronic components including the display unit 110 provided in the door 20 from being damaged or degraded by the heat and the oil mist.

Referring to FIG. 11, the air guide 140 may include the inlet 141 and a mounting hole 142. The inlet 141 may be disposed on an upper portion of the air guide 140, external air may be introduced through the inlet 141, and at least one inlet 141 may be provided.

The inlet 141 may be disposed at a location corresponding to the first aperture 121 provided on the upper portion of the outer panel 120. Accordingly, the external air may pass through the first aperture 121 of the outer panel 120 to flow into the door 20 through the inlet 141.

The mounting hole 142 may be formed in a lower portion of the inlet 141 in the air guide 140, and the blower 150 may be mounted therein. The mounting hole 142 may pass through the air guide 140 in the frontward-rearward direction of the door 20.

The inlet 141 may be formed in the upward-downward direction of the air guide 140, and the mounting hole 142 may be formed in the frontward-rearward direction of the air guide 140. This structure may allow the air introduced through the inlet 141 to flow in the upward-downward direction of the air guide 140 and then flow in the frontward-rearward direction of the air guide 140 due to a change in the flow path. In other words, air may flow from the upper portion to the lower portion of the air guide 140 through the inlet 141, and its direction may be changed, so that the air may flow from a rear to a front of the air guide 140 through the mounting hole 142.

The blower 150 may include a casing 151 and the blowing fan 152. The casing 151 may be disposed in the mounting hole 142 and formed with a hollow, and the blowing fan 152 may be mounted in the hollow.

The blowing fan 152 may be rotatably mounted in the casing 151, and may blow air from the rear to the front of the air guide 140. The blowing fan 152 may receive electricity and rotate to blow air inside of the door 20.

By rotation of the blowing fan 152, external air may flow into the door 20 through the inlet 141, and may be discharged to the outside of the door 20 through the first outlet 123 and the second outlet 124. The mounting hole 142 of the air guide 140 may be formed in a middle of the casing 151 and correspond to a location, area, and shape of the hollow in which the blowing fan 152 is disposed.

Referring to FIG. 7, the air guide 140 and the inner panel 130 may form a first space 20a in which the inlet 141 is formed by being coupled to each other, and a second space 20b disposed below the first space 20a and in which the blower 150 is mounted. The air introduced into the door 20 may flow in the first space 20a in the upward-downward direction of the door 20 and then flow in the frontward-rearward direction of the door 20 in the second space 20b due to a change in the flow path to pass through the mounting hole 142 of the air guide 140.

A third space 20c through which the air passing through the blowing fan 152 provided in the blower 150 is introduced and distributed to flow toward the first outlet 123 and the second outlet 124 may be formed between the air guide 140 and the outer panel 120.

A front of the third space 20c may be closed by the display unit 110, for example. Accordingly, the air introduced into the third space 20c by the blowing fan 152 may be branched to flow upward and downward, and the branched air may be discharged to the outside of the door 20 through the first outlet 123 and the second outlet 124.

Hereinafter, the airflow inside of the door 20 will be described with reference to FIG. 7. In FIG. 7, the airflow is indicated by arrows. The air introduced into the third space 20c through the mounting hole 142 is branched to flow upward and downward, and branched air is discharged to an outside of the door 20 through the first outlet 123 and the second outlet 124.

As the blowing fan 152 rotates, external air may flow into the door 20 through the inlet 141 of the air guide 140, and flow to be discharged to the outside of the door 20 through the first outlet 123 and the second outlet 124. The air forcibly blown by the blowing fan 152 may specifically have the following flow path.

The air may flow into the door 20 from the first aperture 121 of the outer panel 120 and the inlet 141 provided at a location corresponding thereto. The air flowing into the door 20 may flow downward from the door 20 to flow into the blowing fan 152.

The air may pass through the blowing fan 152 in the frontward-rearward direction of the door 20. At this time, the air may pass through the mounting hole 142 of the air guide 140 while passing through the blowing fan 152. A flow direction of the air in the blowing fan 152 may be changed from the upward-downward direction of the door 20 to the frontward-rearward direction thereof.

As a front of the mounting hole 142 is blocked by the display unit 110, the air passing through the mounting hole 142 may be branched in the upward-downward direction in front of the air guide 140.

A part or first portion of the branched air may flow in an upward direction of the door 20 and may be discharged through the first outlet 123. The other part or a second portion of the branched air may flow in a downward direction of the door 20 and may be discharged through the second outlet 124.

The air may flow downward through the inlet 141 to be introduced into the first space 20*a* inside of the door 20. The flow direction of the air may be changed to the frontward-rearward direction of the air guide 140 in the second space 20*b* and thus the air may pass through the mounting hole 142.

As the front of the third space 20*c* is closed, the air introduced into the third space 20*c* through the mounting hole 142 may be branched to flow in the third space 20*c* in the upward-downward direction and discharged to the outside of the door 20 through the first outlet 123 and the second outlet 124. This structure may allow the air to flow through the entire third space 20*c* to be discharged to the outside of the door 20 at a location adjacent to the top and bottom of the display unit 110.

The air branched from the first outlet 123 and the second outlet 124 may surround the entire door 20. In particular, the branched air may surround a front surface of the door 20. This structure may allow the air discharged from the first outlet 123 and the second outlet 124 to form the air curtain on the door 20, thereby effectively preventing heat and oil mist generated from the heating cooking device disposed below the cooking appliance from permeating into the door 20.

At least a portion of the air discharged from the first outlet 123 may come into contact with the front surface of the display unit 110 while moving downward by gravity to cool the display unit 110. In addition, the above-described airflow structure inside of the door 20 may allow the air flowing into the door 20 to flow through the entire inside of the door 20. For example, the air may flow in the entire space formed by the rear surface of the display unit 110 and the outer panel 120.

Accordingly, the air flowing inside of the door 20 may cool the entire rear surface of the display unit 110, and effectively cool the outer panel 120 and other components mounted on other portions of the door 20. In particular, the outer panel 120 may be provided with components that generate heat, such as the speaker 260, the microphone 270, the communication unit 280, and the control board 290. These heat-generating components may be disposed over the entire outer panel 120. Accordingly, the air may flow through the entire inside of the outer panel 120, thereby effectively cooling these heat-generating components.

As shown in FIG. 7, the first aperture 121 and the inlet 141 into which air flows may communicate with each other. As the blowing fan 152 rotates, the external air may flow into the air guide 140 through the first aperture 121 and the inlet 141 to flow toward the blower 150 through the space formed by the inner panel 130 and the air guide 140.

The air may flow toward the blowing fan 152 of the blower 150 in the space formed by the frame 160. The air may pass through the blowing fan 152 and collide with the rear surface of the display unit 110 disposed to face the blowing fan 152 to cool the display unit 110.

After the air passing through the blowing fan 152 collides with the rear surface of the display unit 110, the flow may be branched in the upward and downward directions of the display unit 110. The air directed to the upper side of the display unit 110 may be discharged to the outside of the door 20 through the first outlet 123 provided on the upper portion of the outer panel 120. The air directed to the lower side of the display unit 110 may be discharged to the outside of the door 20 through the second outlet 124 provided on the lower portion of the outer panel 120.

In this embodiment, the air flowing inside of the door 20 may cool the entire front surface of the display unit 110 while being discharged through the first outlet 123. In addition, the air flowing inside of the door 20 may effectively cool the heat-generating components mounted on the rear surface of the display unit 110 and inside of the door 20.

Figure 12:
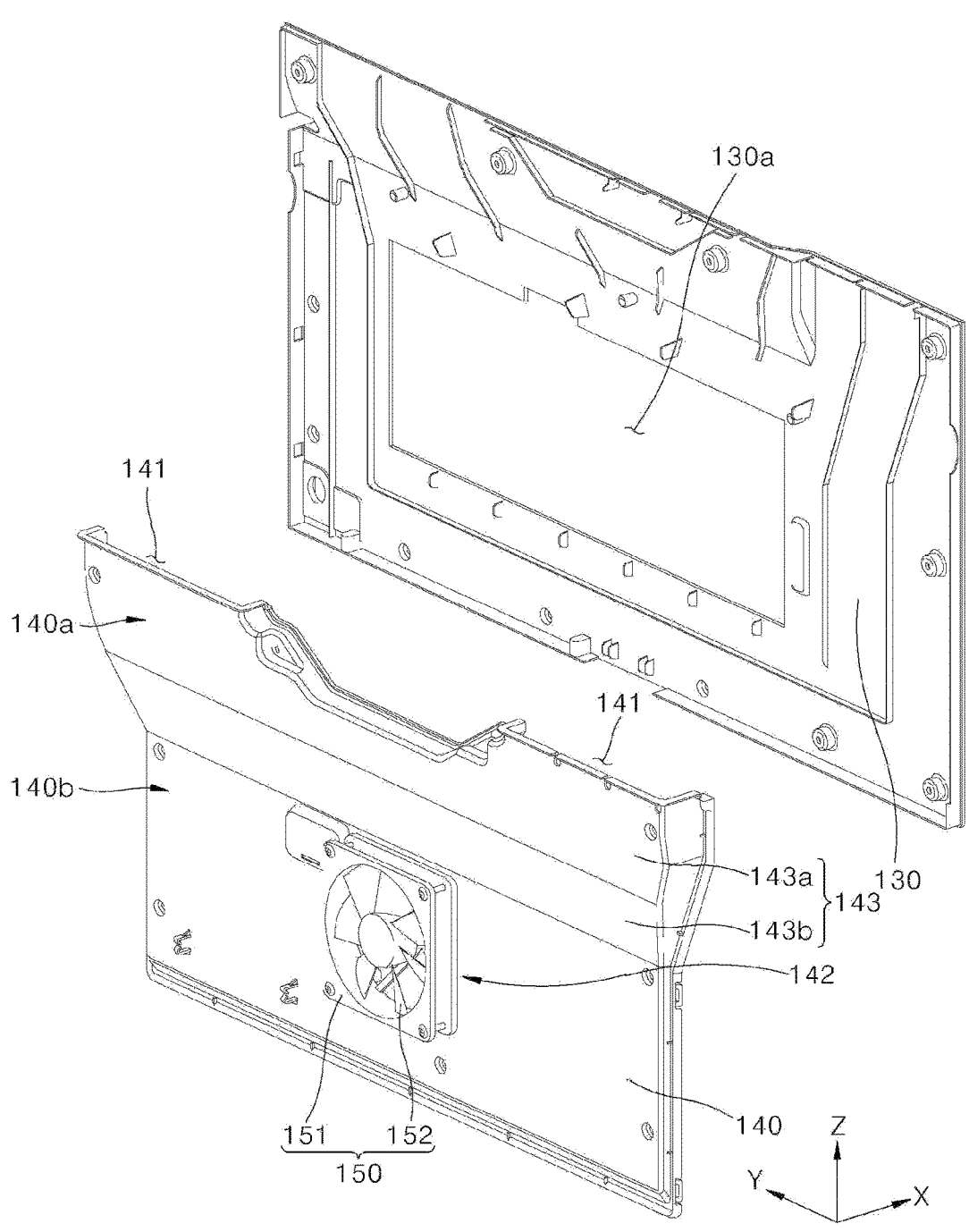
FIG. 12 is an exploded perspective view of the inner panel and air guide of FIG. 11.
Figure 13:
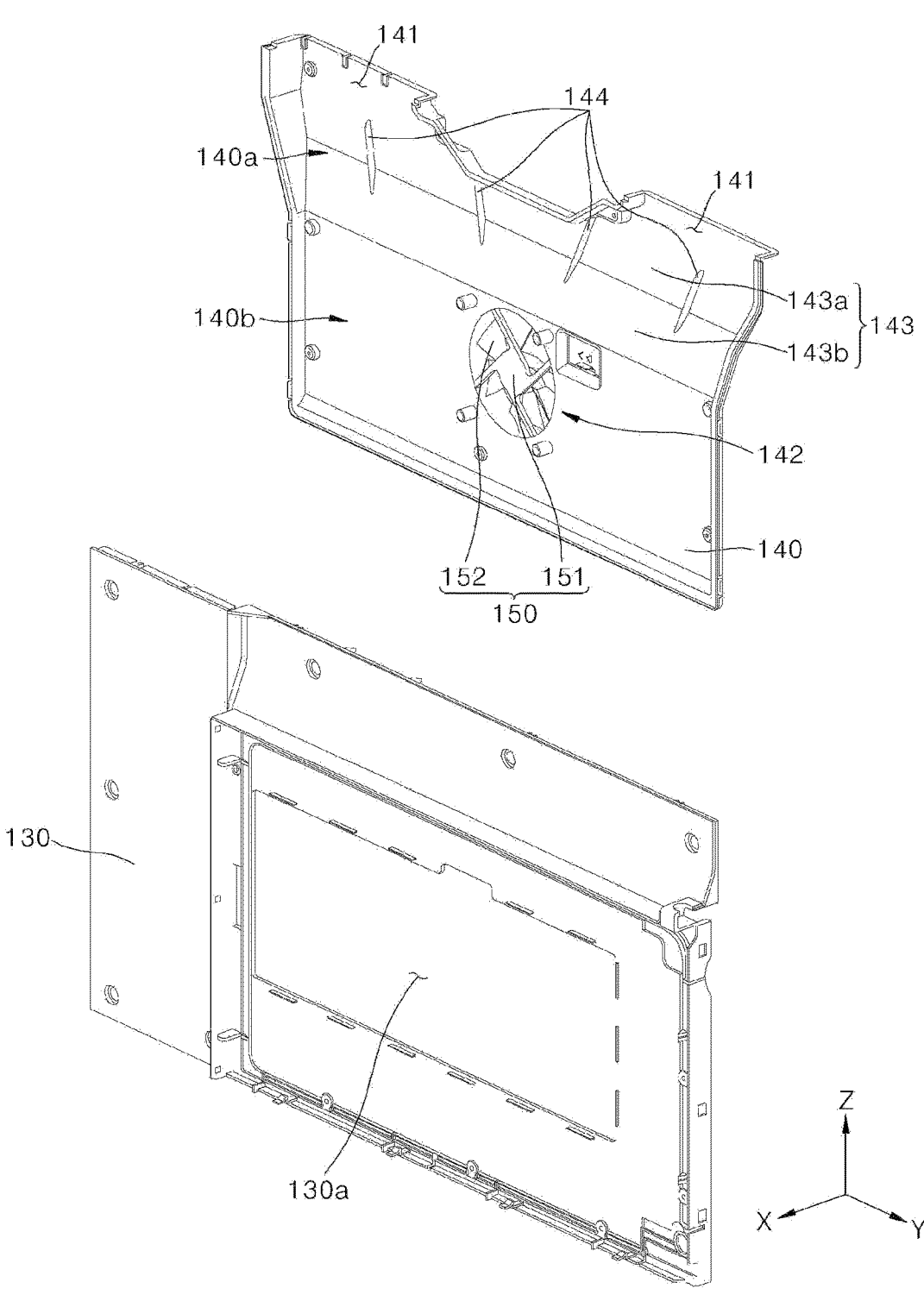
FIG. 13 is a view of the inner panel and air guide of FIG. 12 from another direction.
Figure 14:
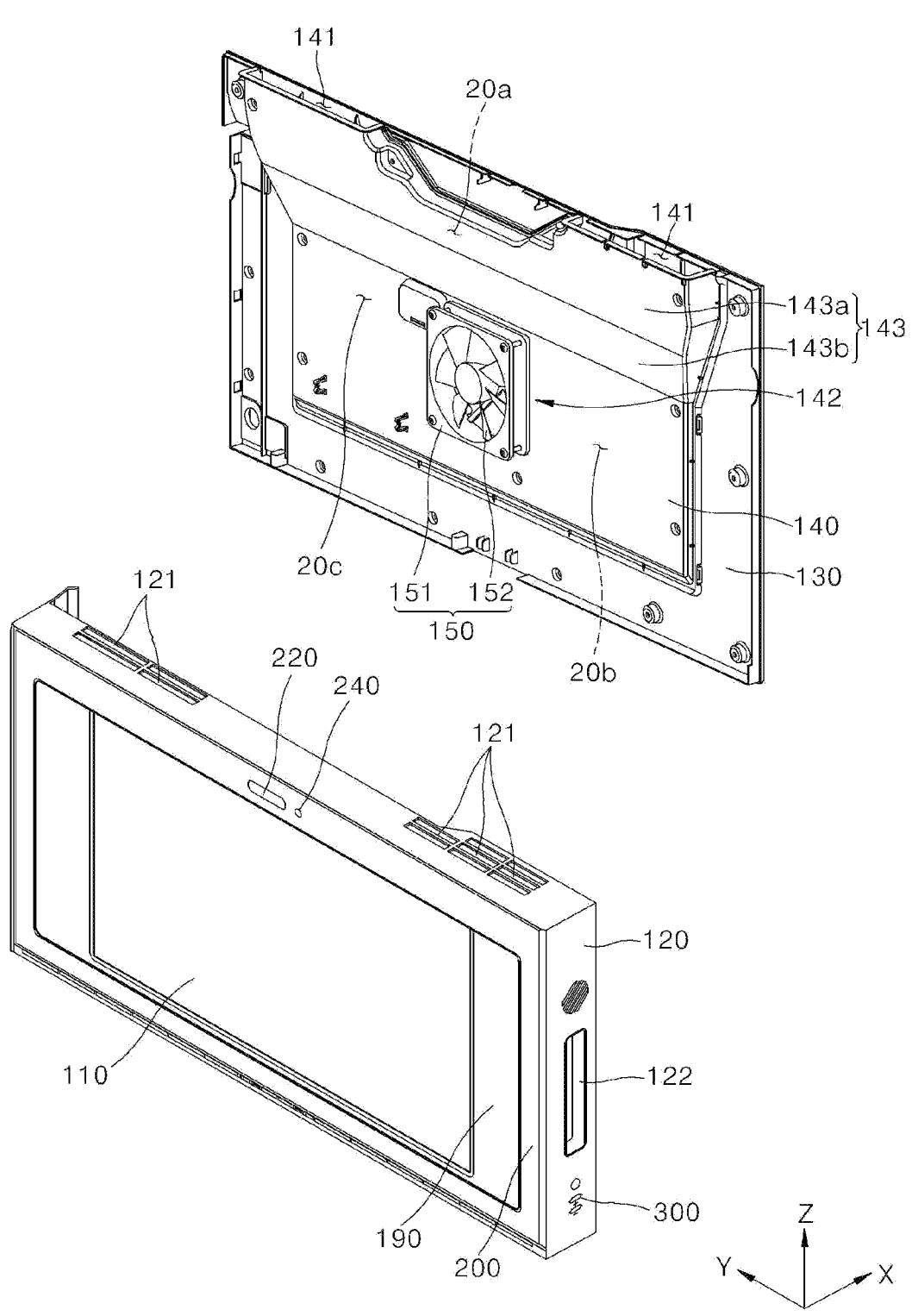
FIG. 14 is an exploded perspective view of the inner panel and the air guide in the door according to an embodiment.

FIG. 12 is an exploded perspective view of the inner panel and air guide of FIG. 11. FIG. 13 is a view of the inner panel and air guide of FIG. 12 from another direction. FIG. 14 is an exploded perspective view showing the inner panel and the air guide in the door according to an embodiment.

Referring to FIG. 13, the mounting hole 142 may be formed in the middle of the air guide 140. The casing 151 has a hollow having a location, size, and shape corresponding to the mounting hole 142, and the blowing fan 152 may be disposed in the hollow. The casing 151 may be disposed at a location corresponding to the hollow and the mounting hole 142 of the air guide 140 and mounted on one surface of the air guide 140.

A hollow 130*a* may be formed in the inner panel 130. As the hollow 130*a* of the inner panel 130 is blocked by the frame 160, the air introduced through the inlet 141 may not leak into the hollow 130*a* of the inner panel 130. Accordingly, the inner panel 130 and the frame 160 together may form a flow path through which the air cooling the inside of the door 20 may flow.

For the user's convenience and aesthetic sense, the door 20 may be manufactured in a slim shape by reducing a width in the frontward-rearward direction. However, as the cross-sectional area of the inlet 141 through which air is introduced increases, the air may be smoothly introduced into the door 20, and the cooling effect and the air curtain forming effect of the door 20 may be increased.

Hereinafter, a structure of the door 20 that is slim as a whole and has an expanded cross-sectional area of the inlet 141 will be described with reference to FIGS. 11 to 14. Referring to FIGS. 11 and 12, a cross-section area of the first space 20*a* may increase from a bottom toward a top of the door 20. Accordingly, the cross-sectional area of the first space 20*a* may be maximized at an upper end of the first space 20*a*, that is, at the inlet 141.

As the third space 20*c* is bounded by the first space 20*a* and the air guide 140, a shape of the third space 20*c* may have a shape opposite to a shape of the first space 20*a*. Accordingly, the cross-sectional area of the third space 20*c* may increase from the bottom toward the top of the door 20 at a boundary point between the first space 20*a* and the second space 20*b*. The second space 20*b* may communicate with the third space 20*c* via mounting hole 142, and the blowing fan 152 may blow air from the second space 20*b* to the third space 20*c*.

Due to the above-described structure, when looking at the air guide 140 from the top of the air guide 140, the cross-sectional area of the first space 20*a* including the inlet 141 may be greater than the cross-sectional area of the second space 20*b*. As the cross-sectional area of the inlet 141 and the first space 20*a* increases, external air may smoothly flow into the first space 20a through the inlet 141. Accordingly, air may be smoothly introduced into the door 20, and the cooling effect and the air curtain forming effect of the door 20 may be increased.

The air guide 140 may include an inclined portion 143 inclined in the upward-downward direction to increase the cross-sectional area of the first space 20a from the bottom toward the top of the air guide 140. The inclined portion 143 may include a first end 143a and a second end 143b.

The first end 143a may be formed at an upper portion of the inclined portion 143 and have a relatively gentle inclination. The second end 143b may be formed at a lower portion of the inclined portion 143, connected to the first end 143a, and have a steeper inclination compared to the first end 143a.

Referring to FIG. 13, the air guide 140 may include a guide fin 144 that protrudes from an inner wall of the air guide 140 at a location at which the first space 20a is formed, disposed so that a longitudinal direction faces the mounting hole 142, and that guides the air introduced into the inlet 141 to flow into the mounting hole 142.

The guide fin 144 may be formed so that it is slightly inclined in the longitudinal direction with respect to the upward-downward direction of the air guide 140 to be placed toward the mounting hole 142 from the top toward the bottom. Accordingly, the air introduced through the inlet 141 may be guided by the guide fin 144 to smoothly move toward the mounting hole 142. In this embodiment, the guide fin 144 is mounted on the air guide 140 to guide the flow of the air, and thus, the air introduced through the inlet 141 may be smoothly moved to the mounting hole 142.

The air guide 140 may include an upper portion 140a in which the inlet 141 is formed and a lower portion 140b in which the blower 150 is disposed. When the air guide 140 and the inner panel 130 are coupled, the lower portion 140b may be generally disposed at a location corresponding to the hollow 130a of the inner panel 130.

When looking at the air guide 140 from the upper portion of the door 20, a cross-sectional area of the upper portion 140a of the air guide 140 may be greater than a cross-sectional area of the lower portion 140b. As the cross-sectional area of the upper portion 140a is expanded, the cross-sectional area of the inlet 141 may also be expanded. Accordingly, in the air guide 140, the inlet 141 into which air flows is expanded, so that external air may easily flow into the air guide 140.

The lower portion 140b of the air guide 140 may have a smaller cross-sectional area than that of the upper portion 140a, but the lower portion 140b of the air guide 140 corresponds to the hollow 130a of the inner panel 130, thus, the airflow space in the portion corresponding to the lower portion 140b may be expanded toward the frame 160 by the hollow 130a of the inner panel 130. As a result, the lower portion 140b of the air guide 140 may also have a shape in which the airflow space is expanded by the hollow 130a of the inner panel 130.

In other words, the lower portion 140b of the air guide 140 corresponding to the hollow 130a of the inner panel 130 is formed to have a smaller cross-sectional area than that of the upper portion 140a of the air guide 140, but the flow space of the lower portion 140b of the air guide 140 may be expanded to the frame 160 by the hollow 130a of the inner panel 130. Accordingly, the upper portion 140a and the lower portion 140b of the air guide 140 may have the shape of an expanded cross-sectional area due to the above-described structure. Accordingly, the airflow space formed by coupling the air guide 140 and the inner panel 130 in the structure in which the air guide 140 and the inner panel 130 are coupled may be sufficiently wide, and air may be smoothly introduced from the outside and may also smoothly pass through the blower 150 mounted on the lower portion 140b of the inner panel 130.

In addition, due to the decrease in cross-sectional area of the lower portion 140b of the air guide 140, conversely, the space in which the air passing through the blower 150 is discharged from the lower portion 140b of the air guide 140 may be expanded. The air passing through the blower 150 may pass through the hollow 1201 of the outer panel 120 and come into contact with the display unit 110 to cool the display unit 110.

The above-described structure may allow the door 20 to have a slim overall structure and increase a flow rate of air flowing therein, thereby improving cooling efficiency of the door 20.

Embodiments disclosed herein provide a cooking appliance having a display unit provided on a front surface in order to provide various types of information to the user. Further, embodiments disclosed herein provide a cooking appliance having a display unit provided on a door of the cooking appliance using microwaves. Furthermore, embodiments disclosed herein provide a cooking appliance having structure capable of preventing heat and oil mist, for example, generated from a heating cooking device disposed thereunder from penetrating into a door.

Embodiments disclosed herein provide a cooking appliance having structure capable of preventing a display unit from being contaminated by oil mist. In addition, embodiments disclosed herein provide a cooking appliance having a cooling structure of a display module attached to a front surface of a door.

Embodiments disclosed herein provide a cooking appliance having structure capable of preventing heat and oil mist, for example, from penetrating into a door by forming an air curtain outside the door. Also, embodiments disclosed herein provide a cooking appliance having a door equipped with a display unit on a front surface thereof and formed with a cooling structure for cooling the display unit and a microwave shielding structure for preventing microwave leakage. Embodiments disclosed herein additionally provide a cooking appliance having structure capable of effectively cooling components mounted on a door.

Advantages are not limited to the above-described advantages, and other advantages not mentioned may be understood from the description, and will be more clearly understood by the embodiments. In addition, it will be easily seen that the advantages may be realized by the means described in the claims and combinations thereof.

A cooking appliance according to embodiments disclosed herein may include a main body formed with a cavity, and a door that opens and closes the cavity. The door may include a display module disposed in front of the door, a cooling flow path unit flow path disposed behind the display module, and having a flow path through which air for cooling flows formed therein, and a shielding unit disposed behind the cooling flow path unit, and configured to shield electromagnetic waves generated from the main body. The air flowing through the cooling flow path unit may be branched from an inside of the cooling flow path unit to be discharged to a top and bottom of the display module.

The door may include a display unit configured to display videos or images, an outer panel disposed behind the display unit and on which the display unit is mounted, an inner panel disposed behind the outer panel, and mounted on the outer panel, an air guide disposed between the outer panel and the inner panel, and coupled to the inner panel, and a blowing device or blower mounted on the air guide. The air guide may include at least one inlet disposed on an upper portion, and through which external air is introduced, and a mounting hole formed under the inlet, and in which the blowing device is mounted. The inlet may be formed in an upward-downward direction of the air guide, and the mounting hole may be formed in a frontward-rearward direction of the air guide.

The blowing device may include a casing disposed in the mounting hole, and a blowing fan rotatably mounted in the casing, and flowing air from a rear to a front of the air guide. The outer panel may include a first outlet disposed on an upper portion to discharge the air flowing by the blowing device to the outside, and a second outlet disposed on a lower portion to discharge the air flowing by the blowing device to the outside.

The air forcibly blown by the blowing fan may specifically have the following flow path.

The air forcibly blown by the blowing fan may be introduced from the inlet to flow in a downward direction of the door to be introduced into the blowing fan, may pass through the blowing fan in a frontward-rearward direction of the door, and may be branched in an upward-downward direction in front of the air guide, a part or a first portion of which may flow in an upward direction of the door to be discharged through the first outlet, and the other part or a second portion of which may flow in the downward direction of the door to be discharged through the second outlet.

A first aperture into which external air flows may be formed at a location corresponding to the inlet on an upper surface of the outer panel. The air guide and the inner panel may form a first space having the inlet formed therein by being coupled to each other, and a second space disposed under the first space and in which the blowing device is mounted. A third space through which the air passing through the blowing fan is introduced and distributed to flow toward the first outlet and the second outlet may be formed between the air guide and the outer panel.

A cross-sectional area of the first space may be provided to increase from a bottom toward a top of the door. A cross-sectional area of the third space may be provided to increase from the bottom toward the top of the door at a boundary point between the first space and the second space. The mounting hole may communicate the second space with the third space, and the blowing fan may flow the air from the second space to the third space.

The air guide may include an inclined portion disposed to be inclined in an upward-downward direction to increase the cross-sectional area from a bottom toward a top of the air guide. The air guide may include a guide fin provided to protrude from an inner wall of the air guide at a location at which the first space is formed, disposed so that a longitudinal direction faces the mounting hole, and guiding the air introduced into the inlet to flow into the mounting hole.

The door may further include a baffle disposed in front of the display unit, surrounding an edge of the display unit, and coupled to the outer panel to mount the display unit on the outer panel, and a front cover disposed in front of the baffle, and provided to surround an edge of the baffle, and a frame disposed behind the inner panel, coupled to the inner panel, and having one side rotatably coupled to the main body. The door may further include a first camera mounted on a lower portion of the outer panel to capture a state of a lower portion of the door, a second camera disposed on an upper portion of the door, mounted by passing through the baffle and the front cover, and capturing a state of a front of the door, and a third camera mounted on the frame, disposed to face the cavity, and capturing a state of the cavity. The door may further include a human detection unit or human detector disposed on the upper portion of the door, mounted by passing through the baffle and the front cover, disposed at a location spaced apart from the second camera, and detecting a presence of a user in front of the cooking appliance.

In the cooking appliance according to embodiments disclosed herein, as the display module is provided on the front of the door, the user may know a cooking situation in the cooking appliance through the display module. The display module may serve as a hub of another home appliance to provide various types of information to the user, thereby enhancing user convenience.

In addition, in the cooking appliance according to embodiments disclosed herein, the air branched from the first outlet and the second outlet may surround the entire door. In particular, the branched air may surround the front portion of the door. This structure may allow the air discharged from the first outlet and the second outlet to form an air curtain on the door, thereby effectively preventing heat and oil mist generated from the heating cooking device disposed below the cooking appliance from permeating into the door.

Accordingly, it is possible to effectively prevent various electronic components including the display unit provided on the door from being damaged or degraded by heat and oil mist. In addition, it is possible to prevent the display unit from being contaminated by the heat and the oil mist and thus giving inconvenience to the user.

Further, in the cooking appliance according to embodiments disclosed herein, the air flowing inside of the door may be discharged through the first outlet to cool the entire front surface of the display unit. In addition, the air flowing inside of the door may effectively cool heat-generating components mounted on the rear surface of the display unit and inside of the door.

Furthermore, in the cooking appliance according to embodiments disclosed herein, as cross-sectional areas of the inlet and the first space increase, external air may smoothly flow into the first space through the inlet. Accordingly, it is possible to smoothly blow the air into the door, and increase the cooling effect and the air curtain forming effect of the door.

In addition, in the cooking appliance according to embodiments disclosed herein, the guide fin may be mounted on the air guide to guide the flow of the air, so that the air introduced through the inlet may be smoothly moved to the mounting hole.

Also, in the cooking appliance according to embodiments disclosed herein, a door having all of the display structure, the cooling structure, and the shielding structure of the electromagnetic waves may be formed. The display structure, the cooling structure, and the shielding structure may be coupled to one another to slimly form the door as a whole. Accordingly, it is possible to prevent a thickness of the door from being increased even when all of the display structure, the cooling structure, and the shielding structure are formed on the door.

Embodiments have been described with reference to the exemplary drawings, but it is apparent that the embodiments are not limited by the embodiments and drawings disclosed in this specification, and various modifications may be made by those skilled in the art without departing from the technical spirit. In addition, although operations and effects according to the embodiments have not been explicitly disclosed and described while describing the embodiments, it goes without saying that predictable effects by the corresponding configuration should also be recognized.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower" and "upper", for example, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A cooking appliance comprising a main body in which a cavity is formed, and a door that opens and closes the cavity, wherein the door includes:
   a display module; and
   a cooling flow path unit disposed behind the display module, and having a flow path formed therein through which air for cooling flows, wherein the display module includes:
      a display unit disposed in front of the door and configured to display videos or images; and
      an outer panel disposed behind the display unit and on which the display unit is mounted, wherein the cooling flow path unit includes:
         an air guide configured to guide a flow of air introduced into the door, a blower mounted on the air guide; and
         an inner panel disposed behind each of the air guide and the outer panel, wherein the air guide is coupled to the inner panel to form the flow path of air, wherein the inner panel is mounted on the outer panel, and wherein the air guide is disposed between the outer panel and the inner panel.

2. The cooking appliance of claim 1, wherein the air guide includes at least one inlet disposed on an upper portion thereof, and through which external air is introduced, and a mounting hole formed under the at least one inlet, and in which the blower is mounted, and wherein the at least one inlet is formed in an upward-downward direction of the air guide, and the mounting hole is formed in a frontward-rearward direction of the air guide.

3. The cooking appliance of claim 2, wherein the blower includes:
   a casing disposed in the mounting hole; and
   a fan rotatably mounted in the casing, and blowing air from a rear to a front of the air guide.

4. The cooking appliance of claim 3, wherein the outer panel includes:
   a first outlet disposed on an upper portion to discharge the air blown by the blower to the outside; and
   a second outlet disposed on a lower portion to discharge the air blown by the blower to the outside.

5. The cooking appliance of claim 4, wherein the air forcibly blown by the fan is introduced from the at least one inlet to flow in a downward direction of the door to be introduced into the fan, passes through the fan in a frontward-rearward direction of the door, and is branched in an upward-downward direction in front of the air guide, and wherein a first portion of the air flows in an upward direction of the door to be discharged through the first outlet, and a second portion of the air flows in the downward direction of the door to be discharged through the second outlet.

6. The cooking appliance of claim 2, wherein at least one first aperture into which external air flows is formed at a location corresponding to the at least one inlet on an upper surface of the outer panel.

7. The cooking appliance of claim 4, wherein the air guide and the inner panel form a first space in which the at least one inlet is formed, and a second space disposed under the first space and in which the blower is mounted.

8. The cooking appliance of claim 7, wherein a third space through which the air passing through the fan is introduced and distributed to flow toward the first outlet and the second outlet is formed between the air guide and the outer panel.

9. The cooking appliance of claim 8, wherein a cross-sectional area of the first space increases from a bottom toward a top of the door, and a cross-sectional area of the third space increases from the bottom toward the top of the door at a boundary point between the first space and the second space.

10. The cooking appliance of claim 9, wherein the second space and the third space communicate via the mounting hole, and wherein the fan blows the air from the second space to the third space.

11. The cooking appliance of claim 9, wherein the air guide includes an inclined portion inclined in an upward-downward direction to increase the cross-sectional area from a bottom toward a top of the air guide.

12. The cooking appliance of claim 8, wherein air introduced into the door flows in the first space in the upward-downward direction of the door and then flow in the frontward-rearward direction of the door in the second space due to a change in the flow path to pass through the mounting hole of the air guide.

13. The cooking appliance of claim 12, wherein the air introduced into the third space through the mounting hole is branched to flow upward and downward, and branched air is discharged to an outside of the door through the first outlet and the second outlet.

14. The cooking appliance of claim 4, wherein air flows into the at least one inlet and flows along the flow path to cool the rear surface of the display unit, and then flows along the flow path and is discharged to the outside through the first outlet and the second outlet.

15. A cooking appliance comprising a main body in which a cavity is formed, and a door that opens and closes the cavity, wherein the door includes:
   a display module including a display unit disposed in front of the door; and
   a cooling flow path unit disposed behind the display module, and having a flow path formed therein through which air for cooling flows, wherein the cooling flow path unit includes:
      an air guide configured to guide a flow of air introduced into the door, and a blower mounted on the air guide, wherein the air guide includes:
         at least one inlet disposed on an upper portion thereof, and through which external air is introduced; and
         a mounting hole formed under the at least one inlet and passing through the air guide in a frontward-rearward direction, and wherein the blower includes:
            a casing disposed in the mounting hole; and
            a fan rotatably mounted in the casing.

16. The cooking appliance of claim 15, wherein the display module includes:
   the display unit on which videos or images are displayed; and
   an outer panel disposed behind the display unit, and on which the display unit is mounted, and wherein the cooling flow path unit includes:
      an inner panel disposed behind the outer panel, and mounted on the outer panel, and wherein the air guide is disposed between the outer panel and the inner panel, and coupled to the inner panel.

17. The cooking appliance of claim 16, wherein the outer panel includes:
   a first outlet disposed on an upper portion to discharge the air blown by the blower to the outside; and
   a second outlet disposed on a lower portion to discharge the air blown by the blower to the outside.

18. The cooking appliance of claim 17, wherein the air forcibly blown by the fan is introduced from the at least one inlet to flow in a downward direction of the door to be introduced into the fan, passes through the fan in a frontward-rearward direction of the door, and is branched in an upward-downward direction in front of the air guide, and wherein a first portion of the air flows in an upward direction of the door to be discharged through the first outlet, and a second portion of the air flows in the downward direction of the door to be discharged through the second outlet.

* * * * *